(12) United States Patent
Forbes et al.

(10) Patent No.: US 6,380,765 B1
(45) Date of Patent: Apr. 30, 2002

(54) DOUBLE PASS TRANSISTOR LOGIC WITH VERTICAL GATE TRANSISTORS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/649,828

(22) Filed: Aug. 29, 2000

(51) Int. Cl.[7] ............................................. H03K 19/094
(52) U.S. Cl. ........................ 326/112; 326/119; 326/113; 326/101
(58) Field of Search ................................ 326/112, 113, 326/119, 120, 122, 101, 102, 103

(56) References Cited

U.S. PATENT DOCUMENTS 6,124,729 A * 9/2000 Noble et al. .................. 326/41
6,222,788 B1 * 4/2001 Forbes et al. .......... 365/230.06

* cited by examiner

*Primary Examiner*—Michael Tokar
*Assistant Examiner*—Anh Tran
(74) *Attorney, Agent, or Firm*—Schwegman, Lundberg, Woessner & Kluth, P.A.

(57) ABSTRACT

Systems and methods are provided for double pass transistor logic with vertical gate transistors. The vertical gate transistors have multiple vertical gates which are edge defined such that only a single transistor is required for multiple logic inputs. Thus, a minimal surface area is required for each logic input. In one embodiment, a novel integrated circuits described in the present invention includes a number of input lines for receiving input signals and at least one output line for providing output signals. One or more arrays of transistors are coupled between the number of input lines and the at least one output line. Each transistor includes source region and a drain region in a horizontal substrate. A depletion mode channel region separates the source and the drain regions. A number of vertical gates located above different portions of the depletion mode channel region. At least one of the vertical gates is located above a first portion of the depletion mode channel region and is separated from the channel region by a first thickness insulator material. Further at least one of the vertical gates is located above a second portion of the channel region and is separated from the channel region by a second thickness insulator material. The number of vertical gates each have a horizontal width which has sub-lithographic dimensions. In the invention, the number of vertical gates are independently coupled to a number of gate input lines. Thus, the number of vertical gates provide logic inputs such that a minimal area in each logic cell is used for each logic input. Other integrated circuits using the present invention are similarly provided.

104 Claims, 13 Drawing Sheets

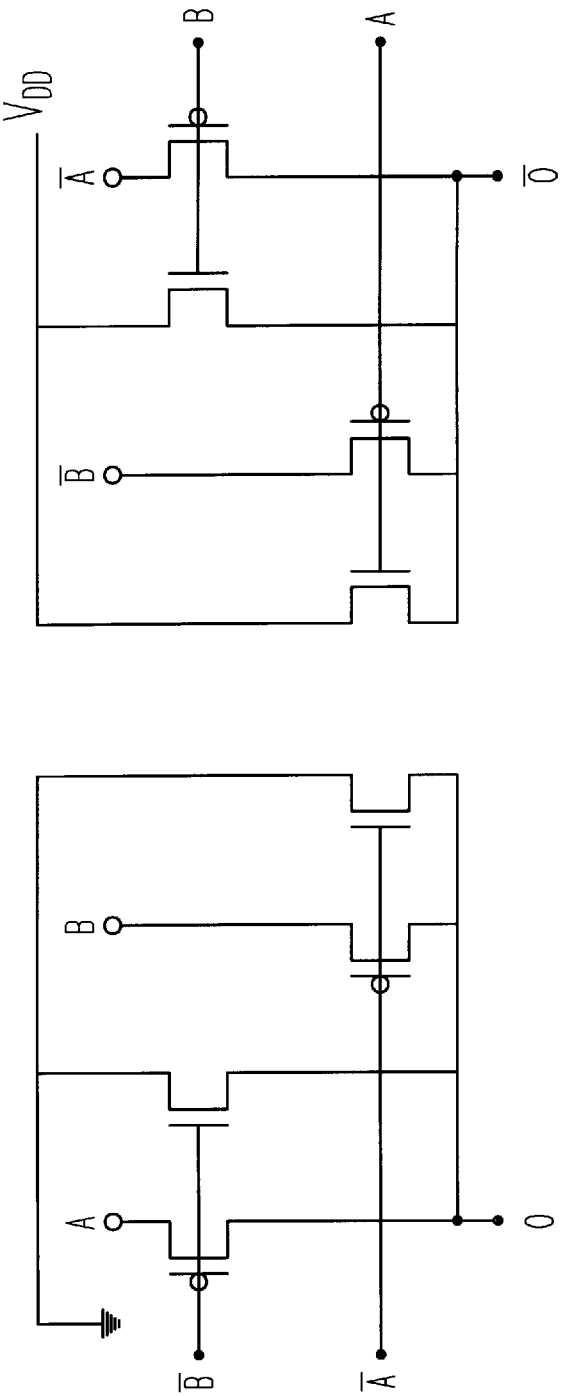
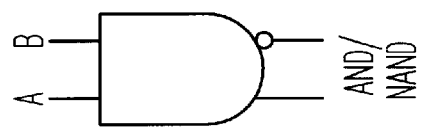
Fig.7A
Fig.7B

DOUBLE PASS TRANSISTOR LOGIC WITH VERTICAL GATE TRANSISTORS

CROSS REFERENCE TO RELATED CO-PENDING AND CO-FILED APPLICATIONS

This application is related to the following co-pending, commonly assigned U.S. patent applications: entitled "Static Pass Transistor Logic with Transistors with Multiple Vertical Gates," Ser. No. 09/580,901; and "Vertical Gate Transistors in Pass Transistor Logic Decode Circuits," Ser. No. 09/580,860, both filed on May 30, 2000 and which disclosures are herein incorporated by reference. This application is further related to the following co-pending, commonly assigned U.S. patent application: "Vertical Gate Transistors in Pass Transistor Programmable Logic Arrays," Ser. No. 09/643,296, which is filed on even date herewith and also incorporated herein by reference.

TECHNICAL FIELD OF THE INVENTION

This invention relates generally to integrated circuits and in particular to double pass transistor logic with vertical gate transistors.

BACKGROUND OF THE INVENTION

Many integrated circuits include multiple transistors arrayed such that a combination of activated transistors produce a logical function. Such transistors in the array are activated, in the case of MOSFET devices, by either applying or not applying a potential to the gate of the MOSFET. This action either turns on the transistor or turns off the transistor. Conventionally, each logical input to the integrated circuit is applied to an independent MOSFET gate. Thus, according to the prior art, a full MOSFET is required for each input to the integrated circuit. Requiring a full MOSFET for each logic input consumes a significant amount of chip surface area. Conventionally, the size of each full MOSFET, e.g. the space it occupies, is determined by the minimum lithographic feature dimension. Thus, the number of logical functions that can be performed by a given integrated circuit is dependent upon the number of logical inputs which is, in turn, dependent upon the available space to in which to fabricate an independent MOSFET for each logic input. In other words, the minimum lithographic feature size and available surface determine the functionality limits of the programmable logic array.

Pass transistor logic is one of the oldest logic techniques and has been described and used in NMOS technology long before the advent of the CMOS technology currently employed in integrated circuits. A representative article by L. A. Glasser and D. W. Dobberpuhl, entitled "The design and analysis of VLSI circuits," Addison-Wesley, Reading, Mass., 1985, pp. 16–20, describes the same. Pass transistor logic was later described for use in complementary pass transistor circuits in CMOS technology. Articles which outline such use include articles by J. M. Rabaey, entitled "Digital Integrated Circuits; A design perspective," Prentice Hall, Upper Saddle River, N.J., pp. 210–222, 1996, and an article by K. Bernstein et al., entitled "High-speed design styles leverage IBM technology prowess," MicroNews, vol. 4, no. 3, 1998. What more, there have been a number of recent applications of complementary pass transistor logic in microprocessors. Articles which describe such applications include articles by T. Fuse et al., entitled "A 0.5V 200 mhz 1-stage 32b ALU using body bias controlled SOI pass-gate logic," Dig. IEEE Int. Solid-State Circuits Conf., San Francisco, pp. 286–287, 1997, an article by K. Yano et al., entitled "Top-down pass-transistor logic design," IEEE J. Solid-State Circuits, Vol. 31, no. 6, pp. 792–803, June 1996, and an article by K. H. Cheng et al., entitled "A 1.2V CMOS multiplier using low-power current-sensing complementary pass-transistor logic", Proc. Third Int. Conf. On Electronics, Circuits and Systems, Rodos, Greece, 13–16 Oct., vol. 2, pp. 1037–40, 1996.

In another approach, double pass transistor logic has been developed to overcome concerns about low noise margins in pass transistor logic. This has been described in an article by S. I. Kayed et al., entitled "CMOS differential pass-transistor logic (CMOS DPTL) predischarge buffer design," 13th National Radio Science Conf., Cairo, Egypt, pp. 527–34, 1996, as well as in an article by V. G. Oklobdzija, entitled "Differential and pass-transistor CMOS logic for high performance systems," Microelectronic J., vol. 29, no. 10, pp. 679–688, 1998. Combinations of pass-transistor and CMOS logic have also been described. S. Yamashita et al., "Pass-transistor CMOS collaborated logic: the best of both worlds," Dig. Symp. On VLSI Circuits, Kyoto, Japan, June 12–14, pp. 31–32, 1997. Also, a number of comparisons of pass transistor logic and standard CMOS logic have been made for a variety of different applications and power supply voltages. These studies are described in an article by R. Zimmerman et al., entitled "Low-power logic styles: CMOS versus pass transistor logic," IEEE J. Solid-State Circuits, vol. 32, no. 7, pp. 1079–1790, July 1997, and in an article by C. Tretz et al., "Performance comparison of differential static CMOS circuit topologies in SOI technology," Proc. IEEE Int. SOI Conference, October 5–8, FL, pp. 123–4, 1998.

Thus, static pass transistor CMOS logic circuits, as shown in FIG. 5A, have been used in CMOS technology and integrated circuits. The main problem with static pass transistor logic circuits is the threshold voltage drop at the input across a pass transistor. If as shown in FIG. 5A the input is high at VDD then if the pass transistor is a normal enhancement mode device the input voltage will rise only to VDD–VTN, where VTN is the threshold voltage of the NMOS transistor. Worse still, it will, in theory, take an infinite amount of time to reach this voltage since the NMOS pass transistor has a final state which has infinite resistance. If, as shown in FIG. 5B, the output of one pass transistor is used to drive the gate of another transistor then the capacitor at the input to the inverter will charge only to VDD–2 VTN. This is, in particular, unacceptable in low power supply circuits and this possibility must be precluded by design rules.

Various techniques have been used to overcome some of the threshold voltage drop problem. One is the use of level restore circuits. The level restore circuits such as shown in FIG. 6A and FIG. 6B are essentially equivalent. If the inverter input is switching high then the output is going low, this low output is used in a feedback circuit to drive the gate of the extra PMOS device low and pull the input up. This is a positive feedback circuit which tends to latch the input high regardless of how slowly the original input signal was rising. In this manner the level restore circuits overcome the threshold voltage drop at the input in pass transistor logic circuits.

Another technique is the development of differential pass transistor logic, as shown in FIGS. 7A and 8A. In differential pass transistor logic both NMOS and PMOS transistors are used as pass transistors and the threshold voltage drop does not occur, one of these transistor is always on in a high conductivity state. FIGS. 9A and 9B illustrate conventional application of differential pass transistor logic in the form of an XOR logic gate and a one bit full adder, sum circuit, respectively.

However, all of these studies and articles on pass transistor logic have not provided a solution to the constraints placed on programmable logic arrays by the limits of the minimum lithographic feature size and the deficit in the available chip surface space in combination with the threshold voltage drop issue.

An approach which touches upon overcoming the limits of the minimum lithographic feature size and the deficit in the available chip surface space, is disclosed in the following co-pending, commonly assigned U.S. patent applications by Len Forbes and Kie Y. Ahn, entitled: "Programmable Logic Arrays with Transistors with Vertical Gates," Ser. No. 09/583,584, "Horizontal Memory Devices with Vertical Gates," Ser. No. 09/584,566, and "Programmable Memory Decode Circuits with Vertical Gates," Ser. No. 09/584,564. Those disclosures are all directed toward a non volatile memory cell structure having vertical floating gates and vertical control gates above a horizontal enhancement mode channel region. In those disclosures one or more of the vertical floating gates is charged by the application of potentials to an adjacent vertical gate. The devices of those disclosures can be used as flash memory, EAPROM, EEPROM devices, programmable memory address and decode circuits, and/or programmable logic arrays. Those applications, however, are not framed to address overcoming the limits of the minimum lithographic feature size and the deficit in the available chip surface space for purposes of double pass transistor logic in other integrated circuit applications.

Therefore, there is a need in the art to provide improved double pass transistor logic in a wide range of integrated circuit applications which do address and resolve the above mentioned problems.

SUMMARY OF THE INVENTION

The above mentioned problems with double pass transistor logic in various integrated circuit applications and other problems are addressed by the present invention and will be understood by reading and studying the following specification. Circuits and methods are provided for double pass transistor logic with vertical transistors in a multitude of additional integrated circuit applications. In the present invention, multiple vertical gates per a single MOSFET serve as multiple logic inputs. The multiple vertical gates are edge defined such that only a single transistor is required for multiple logic inputs. Thus, a minimal surface area is required for each logic input. Further, the invention incorporates double-pass pass and complementary double-pass transistor logic (DPL) in order to provide more noise immunity than pass and complementary pass transistor logic (CPL). Accordingly, the present invention obviates the need for level restore circuits. In circuits with very low power supply voltages it is a good choice in implementing logic functions. According to the teachings of the present invention, the compatibility of DPL with the novel array type structure of novel transistors with multiple vertical gates should allow a very efficient realization of logic circuits and functions.

In one embodiment of the present invention, an integrated circuit is provided. The integrated circuit includes a number of input lines for receiving input signals and at least one output line for providing output signals. One or more arrays of transistors are coupled between the number of input lines and the at least one output line. According to the teachings of the present invention, each transistor includes source region and a drain region in a horizontal substrate. A depletion mode channel region separates the source and the drain regions. A number of vertical gates located above different portions of the depletion mode channel region. At least one of the vertical gates is located above a first portion of the depletion mode channel region and is separated from the channel region by a first thickness insulator material. Further at least one of the vertical gates is located above a second portion of the channel region and is separated from the channel region by a second thickness insulator material. The number of vertical gates each have a horizontal width which has sub-lithographic dimensions. In the invention, the number of vertical gates are independently coupled to a number of gate input lines. Thus, the number of vertical gates provide logic inputs such that a minimal area in each logic cell is used for each logic input.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 7A illustrates a prior art differential pass logic circuit implementation for an AND/NAND gate.

FIG. 7B is a symbol representation for the circuit shown in FIG. 7A.

DETAILED DESCRIPTION OF THE INVENTION

Figure 1A:
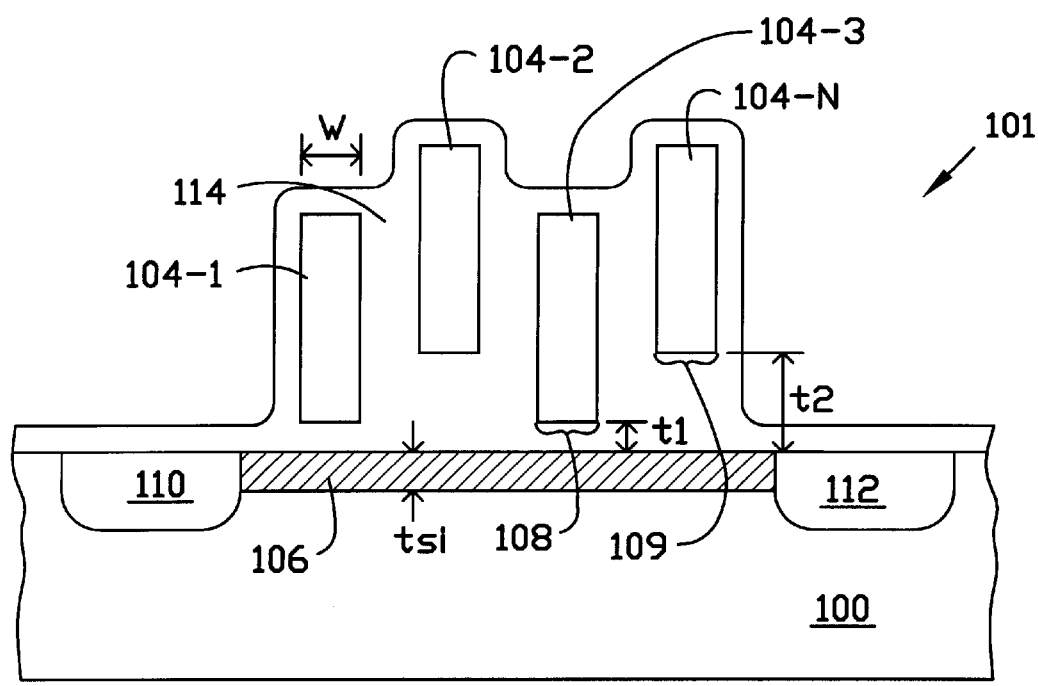
FIG. 1A illustrates a novel static pass transistor according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

According to the teachings of the present invention, a pass transistor logic is described where transistors with multiple vertical gates are employed in static CMOS combinational logic circuits. The pass transistors are similar to a regular series connection of individual transistors except here because of the close proximity of the gates of address lines separate and individual source/drain regions are not required between the gates. An implanted depletion mode channel serves to form the conductive region not only under each gate region but also between different gate regions.

FIG. 1A illustrates a novel static pass transistor 101 according to the teachings of the present invention. As shown in FIG. 1A, the static pass transistor 101 includes a source region 110 and a drain region 112 in a horizontal substrate 100. A depletion mode channel region 106 separates the source region 110 and the drain region 112. A number of vertical gates 104-1, 104-2, . . . , 104-N, are located above different portions of the depletion mode channel region 106. According to the teachings of the present invention, the number of vertical gates 104-1, 104-2, . . . , 104-N, are edge defined vertical gates such that each of the number of vertical gates 104-1, 104-2, . . . , 104-N, has a horizontal width (W) which is sub-lithographic in dimension. In one embodiment, each of the number of vertical gates 104-1, 104-2, . . . , 104-N, has a horizontal width of approximately 100 nanometers (nm). According to one embodiment of the present invention, the number of vertical gates 104-1, 104-2, . . . , 104-N, includes a number of polysilicon vertical gates 104-1, 104-2, . . . , 104-N. At least one of the vertical gates, e.g. vertical gate 104-3, is located above a first portion 108 of the depletion mode channel region 106 and is separated from the depletion mode channel region 106 by a first thickness insulator material (t1). In one embodiment, the first thickness insulator material (t1) includes a first oxide thickness (t1). At least one of the vertical gates, e.g. vertical gate 104-N, is located above a second portion 109 of the depletion mode channel region 106 and is separated from the depletion mode channel region 106 by a second thickness insulator material (t2). In one embodiment, the second thickness insulator material (t2) includes a second oxide thickness (t2). As shown in FIG. 1A, the second oxide thickness (t2) is greater than the first oxide thickness (t1). In one embodiment, the first oxide thickness (t1) is less than 50 Angstroms (Å) and the second oxide thickness (t2) is less than 350 Angstroms (Å). In one embodiment, the first oxide thickness (t1) is approximately 33 Å and the second oxide thickness (t2) is approximately 330 Å.

As shown in FIG. 1A, the number of vertical gates 104-1, 104-2, . . . , 104-N, are parallel and opposing one another. The number of vertical gates 104-1, 104-2, . . . , 104-N, are separated from one another by an integrate dielectric 114. In one embodiment, the integrate dielectric 114 includes silicon dioxide ($SiO_2$). In one embodiment, the number of vertical gates 104-1, 104-2, . . . , 104-N, have a vertical height of approximately 500 nanometers (nm). Also, in one embodiment of the present invention, the horizontal depletion mode channel has a depth (tsi) in the horizontal substrate of approximately 400 Å. According to the teachings of the present invention, the number of vertical gates 104-1, 104-2, . . . , 104-N, serve as logic inputs 104-1, 104-2, . . . , 104-N, for the static pass transistor 101.

Figure 1B:
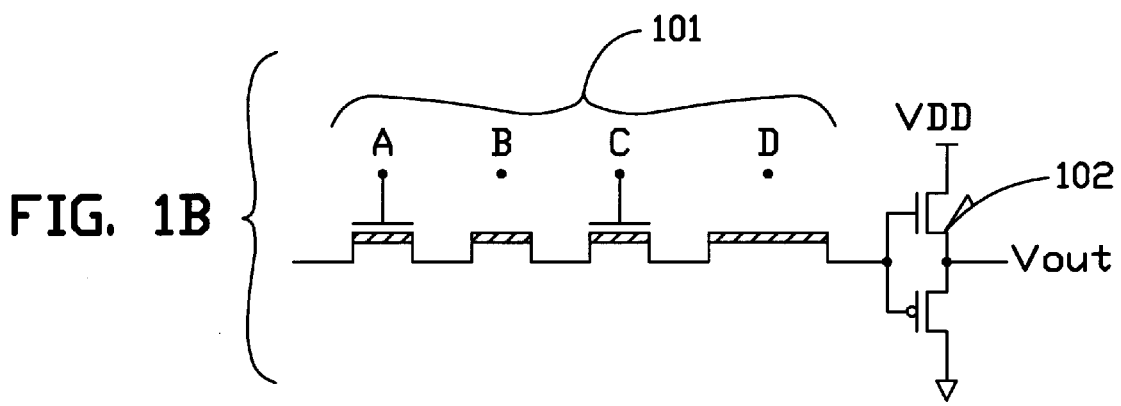
FIG. 1B is a schematic illustration of the novel static pass transistor shown in FIG. 1A.

FIG. 1B is a schematic illustration of the novel static pass transistor shown in FIG. 1A. The schematic of FIG. 1B shows the number of vertical gates 104-1, 104-2, . . . , 104-N, as multiple conductive nodes A, B, C, and D above the horizontal depletion mode channel. An independent potential can be applied to each of the conductive nodes A, B, C, and D. Conductive nodes A and C are represented as gates since they are separated from the depletion mode channel by the first oxide thickness. Conductive nodes B and D are shown just as nodes since they are separated from the depletion mode channel by the second oxide thickness. The static pass transistor 101 is further shown coupled to a buffer mode amplifier 102 to provide gain. The channel is uniformly depletion mode or normally "on" and can conduct with zero potential applied to the conductive nodes A, B, C, and D. In operation, the conductive nodes A and C serve as multiple logic inputs, or active inputs, and can effect conduction in the depletion mode channel. Conductive nodes B and D, on the other hand cannot effect conduction in the depletion mode channel because they are further distanced from the depletion mode channel by the second oxide thickness. In other words, conductive nodes B and D have no control over the depletion mode channel and can not turn the depletion mode channel "off." Conductive nodes B and D thus function as passing lines over the depletion mode channel. In one operation embodiment, if a negative potential is applied to either of the conductive nodes A and C this negative potential works to turn "off" a portion of the depletion mode channel beneath that particular conductive node or gate. In one operation embodiment, a negative potential of approximately −0.6 Volts applied to either conductive node A or C will block conduction in the depletion mode channel. On the other hand, if conductive nodes A and C both have an applied potential of approximately zero Volts then the novel static pass transistor 101 conducts. Thus, in this embodiment, the novel static pass transistor 101 operates as a two input positive logic NAND gate. The conductive nodes A, B, C, and D make up a logic chain. And, the novel static pass transistor can function with an operating voltage range of approximately +/−0.5 Volts.

Figure 1C:
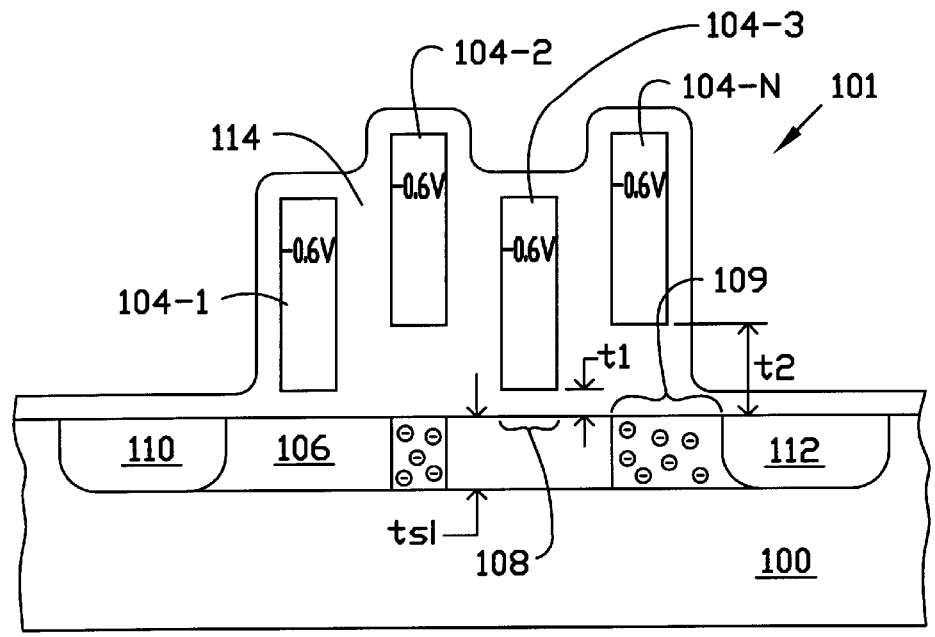
FIG. 1C is an illustration of the operation of the novel static pass transistor described in connection with FIGS. 1A and 1B.

FIG. 1C is an illustration of the operation of the novel static pass transistor described in connection with FIGS. 1A and 1B. FIG. 1C shows four vertical gates 104-1, 104-2, 104-3, and 104-4 formed of heavily doped n+ type polysilicon. The four vertical gates 104-1, 104-2, 104-3, and 104-4 are located above a horizontal depletion mode channel 106 which separates heavily doped n+ type source and drain regions, 110 and 112 respectively. The horizontal depletion mode channel includes a lightly doped n type channel. In FIG. 1C, a independent potential of −0.6 Volts is applied to each of the four vertical gates 104-1, 104-2, 104-3, and 104-4. Vertical gates 104-1 and 104-3 are separated by a first oxide thickness (t1) from the depletion mode channel which is less than a second oxide thickness (t2) separating vertical gates 104-2 and 104-4 from the depletion mode channel. Thus, the negative potential on vertical gates 104-1 and 104-3 turns off conduction in that portion of the depletion mode channel beneath those vertical gates as shown in FIG. 1C. By contrast, the negative potential on vertical gates 104-2 and 104-4 does not control or effect conduction in the depletion mode channel.

Figure 1D:
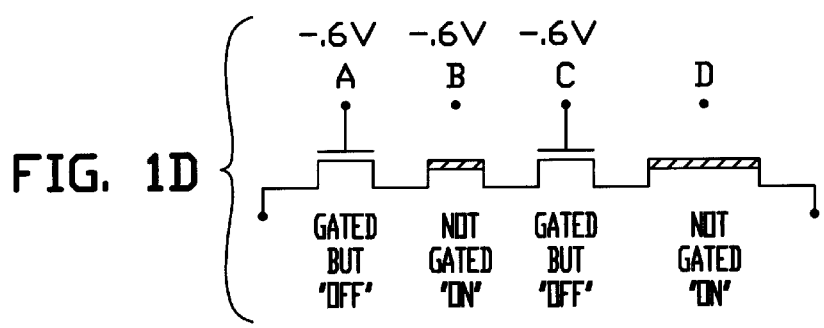
FIG. 1D is another characterization of the novel static pass transistor of FIG. 1C.
Figure 1E:
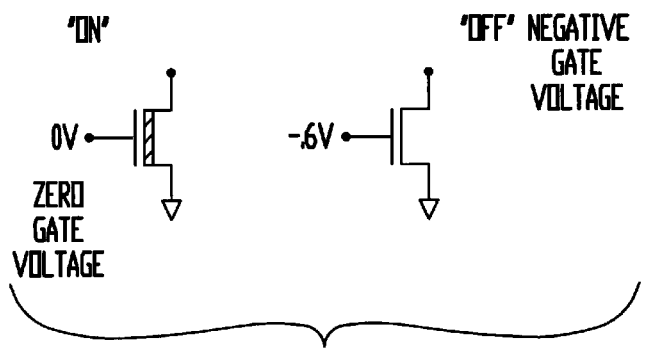
FIG. 1E is a further illustration showing that depletion mode n-channel MOSFETs are "on" with zero gate voltage and that a negative applied gate voltage turns "off" the depletion mode n-channel.

FIG. 1D is another characterization of the novel static pass transistor of FIG. 1C. Conductive nodes A, B, C, and D represent the four vertical gates 104-1, 104-2, 104-3, and 104-4. The regions beneath conductive nodes A and C with their negative applied potentials can be characterized as "gated," but "off." The regions beneath conductive nodes B and D with their negative applied potentials can be characterized as "not gated," or "on" since these conductive nodes are separated from the depletion mode channel by the thicker second oxide thickness. Conductive node B and D thus function as passing lines. FIG. 1E is a further illustration showing that depletion mode n-channel MOSFETs are "on" with zero gate voltage and that a negative applied gate voltage turns "off" the depletion mode n-channel. In one embodiment, the threshold voltage (Vt) required to turn "off" the depletion mode n-channel is approximately −0.6 Volts.

Figure 2A:
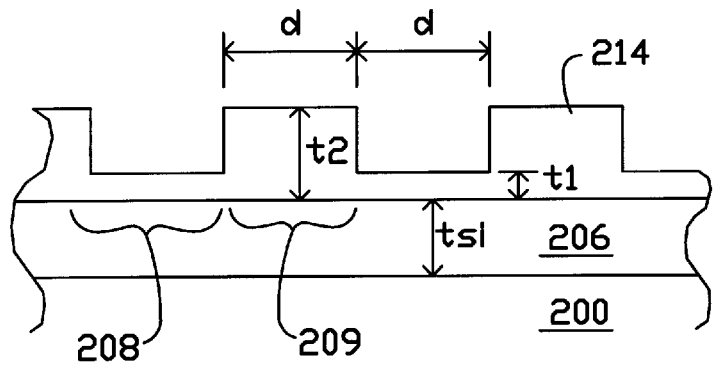
FIG. 2A illustrates one embodiment for the variance between the first oxide thickness (t1) and the second oxide thickness (t2) in the novel static pass transistor of the present invention.
Figure 2B:
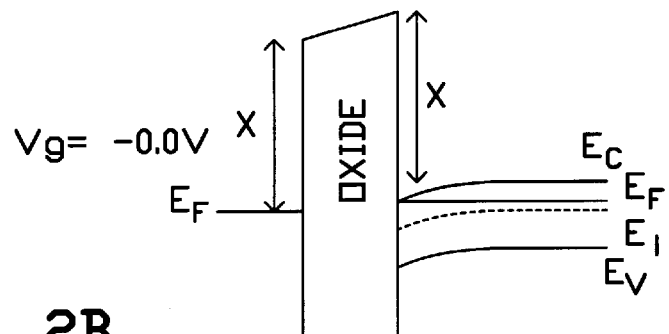
FIG. 2B is an energy band diagram illustrating the effect on the conduction in the depletion mode channel beneath the first oxide thickness (t1) when a zero Volts gate potential (Vg) is applied above according to one embodiment of the present invention.
Figure 2C:
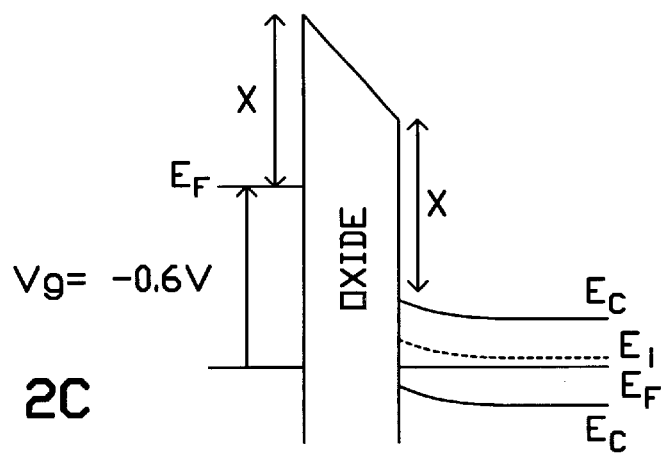
FIG. 2C is an energy band diagram illustrating the effect on the conduction in the depletion mode channel beneath the first oxide thickness (t1) with a negative applied gate potential (Vg) of approximately −0.6 Volts.

FIGS. 2A–2C illustrate an operating voltage range for the novel static pass transistor of the present invention for certain values of a first oxide thickness (t1) and a second oxide thickness (t2). FIG. 2A illustrates one embodiment for the variance between the first oxide thickness (t1) and the second oxide thickness (t2). As shown in FIG. 2A, the first oxide thickness (t1) and the second oxide thickness (t2) are located above a horizontal depletion mode channel 206. In the embodiment shown in FIG. 2A, first oxide thickness (t1) is less than the second oxide thickness (t2). In one embodiment, the first oxide thickness (t1) is approximately 33 Å and the second oxide thickness is approximately 330 Å. As shown in FIG. 2A, the depletion mode channel extends a thickness (tsi) into the horizontal substrate. In one embodiment, the thickness (tsi) is between 100 to 1000 Å. In one embodiment, the thickness (tsi) is approximately 400 Å. For purposes of illustration, the doping concentration (Nd) in this embodiment is approximately $6.25 \times 10^{17}$ atoms/cm$^3$. The capacitance of the oxide (Cox) can be calculated as by dividing the electric permittivity of oxide (approximately $0.353 \times 10^{-12}$ Farads/cm) by the thickness of the oxide. An oxide capacitance (Cox) for the thin or first oxide thickness (t1) of 33 Å is approximately $(0.353 \times 10^{-12}$ Farads/cm$)/(33 \times 10^{-8}$ cm) or approximately $10^{-6}$ Farads/cm$^2$. The charge Qb in the horizontal depletion mode channel is (q)×(Nd)×(tsi), or approximately $0.4 \times 10^{-6}$ Coulombs/cm$^2$. The bulk charge over the oxide capacitance for the thin or first thickness oxide (t1) can be stated as V=Qb/Cox or approximately 0.4 Volts. On the other hand the bulk charge over the oxide capacitance for the thicker or second oxide thickness (t2) of approximately 330 Å will be significantly greater.

FIG. 2B is an energy band diagram illustrating the effect on the conduction in the depletion mode channel beneath the first oxide thickness (t1) when a zero Volts gate potential (Vg) is applied above. As shown in FIG. 2B, when zero (0.0) Volts are applied to a gate (Vg) above the first oxide thickness (t1) the Fermi level (Ef) in the silicon channel will be approximately 0.4 Volts, above the intrinsic level (Ei). In other words, since the horizontal depletion mode channel is doped the Fermi level (Ef) in the channel is above that for intrinsic silicon (Ei), e.g. 0.35 Volts, and closer to the conduction band (Ec). From the illustrative calculations provided above in connection with FIG. 2A the Fermi level (Ef) in the channel is approximately 0.4 Volts. Thus, for a zero Volts gate potential (Vg) the Fermi levels Ef) in the polysilicon gate and the channel are approximately aligned and conduction will occur in the horizontal depletion mode channel.

FIG. 2C is an energy band diagram illustrating the effect on the conduction in the depletion mode channel beneath the first oxide thickness (t1) when a negative gate potential (Vg) of approximately −0.6 Volts is applied above. As shown in FIG. 2C, an applied gate potential (Vg) of a negative −0.6 Volts will raise the Fermi level in a polysilicon vertical gate and suppress the Fermi level in the doped channel beneath the first oxide thickness (t1) to even with or below the Fermi level value for intrinsic silicon such that the Fermi level in the channel is then closer to the valence band (Ev) in the channel. In this state no conduction will occur in this portion of the channel and the channel is turned "off." Thus, an applied potential of approximately a negative −0.6 Volts, accounting for a work function difference of approximately a negative −0.2 Volts and other variables involved such as an oxide charge if any, will be sufficient to overcome the bulk charge over the oxide capacitance (e.g. 0.4 V) across the thin or first thickness oxide (t1) of approximately 33 Å. The negative −0.6 Volts gate potential can thus turn "off" the normally "on" depletion mode channel. In other words, according to the teachings of the present invention, the novel static pass transistor can operate with an operating voltage range of approximately half a Volt (0.6 V).

Figure 3A:
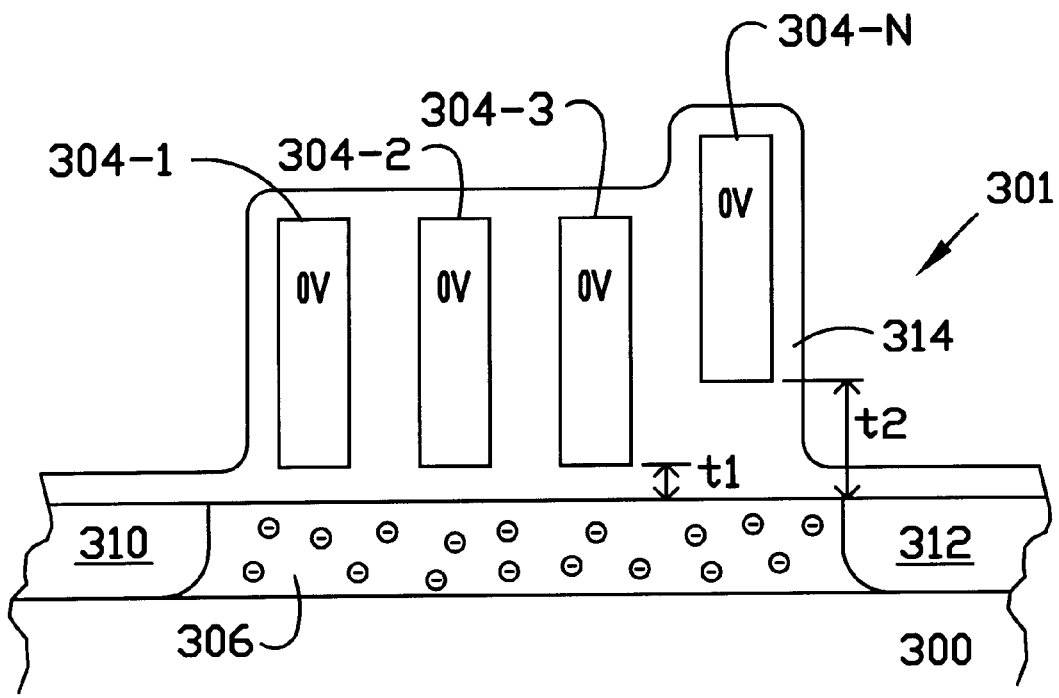
FIG. 3A is an illustration of another embodiment configuration for the novel static pass transistor of the present invention.

FIG. 3A is an illustration of another embodiment configuration for the novel static pass transistor of the present invention. In other words, FIG. 3A shows a different "input" configuration and the conductivity or resistance of the depletion mode channel with different input voltages. FIG. 3A shows four vertical gates 304-1, 304-2, 304-3, and 304-4 formed of heavily doped n+ type polysilicon. The four vertical gates 304-1, 304-2, 304-3, and 304-4 are located above a horizontal depletion mode channel 306 which separates heavily doped n+ type source and drain regions, 310 and 312 respectively. The horizontal depletion mode channel includes a lightly doped n type channel. In the operational embodiment of FIG. 3A, an independent potential of zero Volts is applied to vertical gates 304-1, 304-2, and 304-3. An independent potential of −0.6 Volts is applied to vertical gate 304-4. Vertical gates 304-1, 304-2, and 304-3 are separated by a first oxide thickness (t1) from the depletion mode channel 306 which is less than a second oxide thickness (t2) separating vertical gate 304-4 from the depletion mode channel. As explained and described in detail above, potential applied to vertical gate 304-4 does not control the conduction in the horizontal depletion mode channel due to its separation therefrom by the thicker second oxide thickness. Thus, the negative potential on vertical gates 304-4 does not turn off conduction in that portion of the depletion mode channel beneath it. Further, since an independent potential of zero Volts is applied to vertical gates 304-1, 304-2, and 304-3, there is no reduction in the conduction of the depletion mode channel beneath these vertical gates or active inputs either. However, since vertical gates 304-1, 304-2, and 304-3 are active inputs a negative potential applied independently to any one of these gates would turn "off" conduction in that portion of the depletion mode channel beneath it. In other words, these active inputs 304-1, 304-2, and 304-3 can control or effect conduction in the depletion mode channel.

Figure 3B:
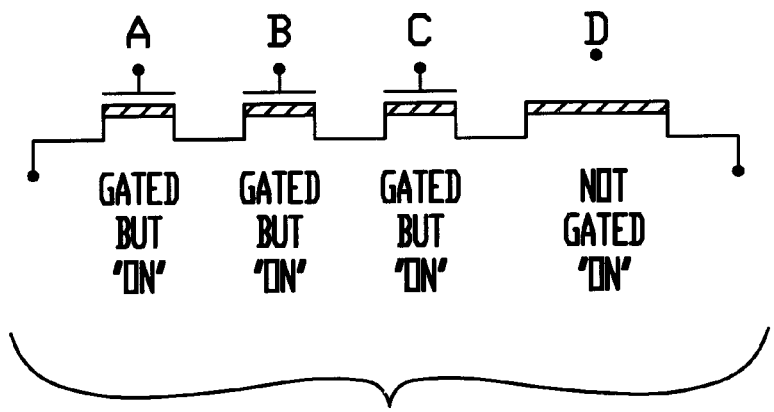
FIG. 3B is another characterization of the novel static pass transistor of FIG. 3A.

FIG. 3B is another characterization of the novel static pass transistor of FIG. 3A. Conductive nodes A, B, C, and D represent the four vertical gates 304-1, 304-2, 304-3, and 304-4. The regions beneath conductive nodes A, B and C with their zero applied potential can be characterized as "gated," but "on." The regions beneath conductive node D with its negative applied potentials can be characterized as "not gated," or "on" since this conductive node is separated from the depletion mode channel by the thicker second oxide thickness. Conductive node D thus functions as a passing line in this embodiment.

Figure 4A:
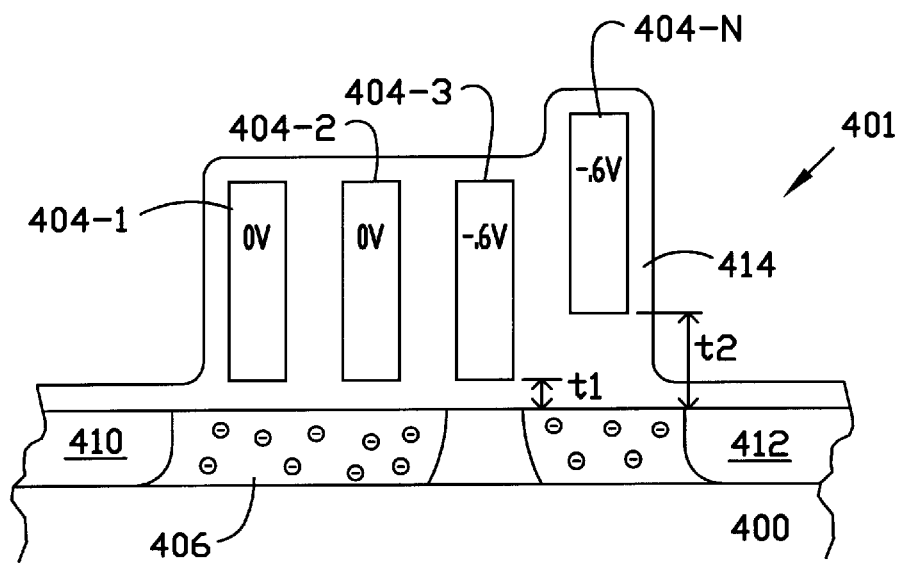
FIG. 4A is an illustration of another operational state for the novel static pass transistor shown in FIGS. 3A and 3B.

FIG. 4A is an illustration of another operational state for the novel static pass transistor shown in FIGS. 3A and 3B. In effect, FIG. 4A shows operation of the novel static pass transistor shown in FIGS. 3A and 3B with different input voltages. FIG. 4A shows four vertical gates 404-1, 404-2, 404-3, and 404-4 formed of heavily doped n+ type polysilicon. The four vertical gates 404-1, 404-2, 404-3, and 404-4 are located above a horizontal depletion mode channel 406 which separates heavily doped n+ type source and drain regions, 410 and 412 respectively. The horizontal depletion mode channel includes a lightly doped n type channel. In the operational embodiment of FIG. 4A, a independent potential of zero Volts is applied to vertical gates 404-1 and 404-2. An independent potential of −0.6 Volts is applied to vertical gates 404-3 and 404-4. Vertical gates 404-1, 404-2, and 404-3 are separated by a first oxide thickness (t1) from the depletion mode channel 406 which is less than a second oxide thickness (t2) separating vertical gate 404-4 from the depletion mode channel. As explained and described in detail above, potential applied to vertical gate 404-4 does not control the conduction in the horizontal depletion mode channel due to its separation therefrom by the thicker second oxide thickness. Thus, the negative potential on vertical gate 404-4 does not turn off conduction in that portion of the depletion mode channel beneath it. Further, since an independent potential of zero Volts is applied to vertical gates 404-1 and 404-2 there is no reduction in the conduction of the depletion mode channel beneath these vertical gates, or active inputs either. However, since vertical gate 404-3 is an active input, the negative potential of −0.6 Volts applied independently to this gate does turn "off" conduction in that portion of the depletion mode channel beneath it.

Figure 4B:
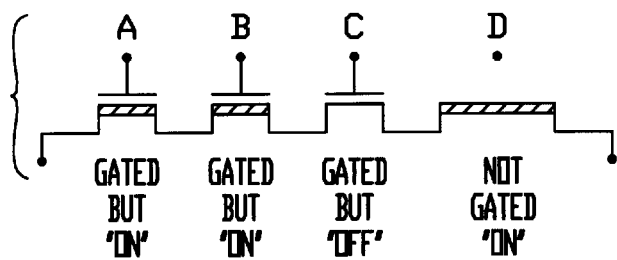
FIG. 4B is another characterization of the novel static pass transistor of FIG. 4A.
Figure 5A:
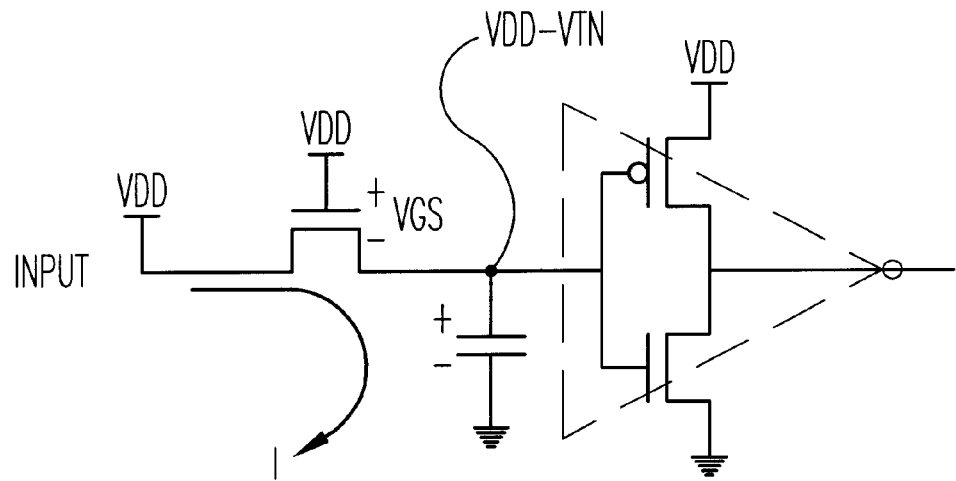
FIG. 5A illustrates a prior art static pass transistor CMOS logic circuit.
Figure 5B:
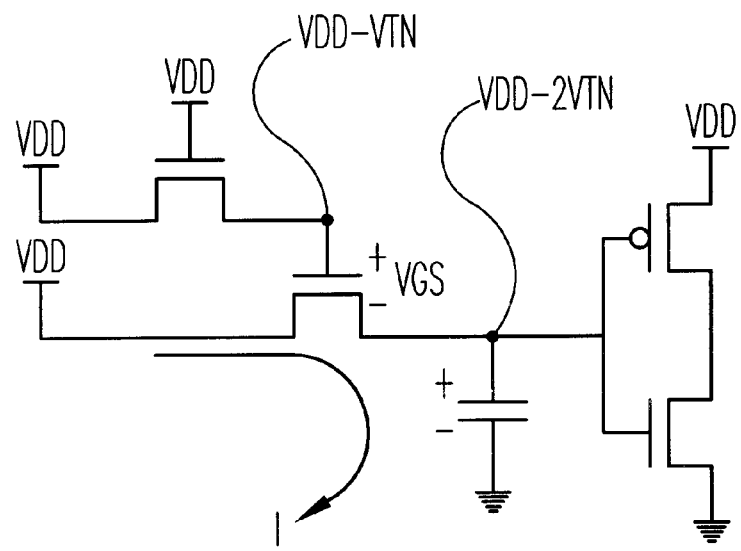
FIG. 5B illustrates another prior art static pass transistor CMOS logic circuit where the output of one pass transistor is used to drive the gate of another transistor.
Figure 6A:
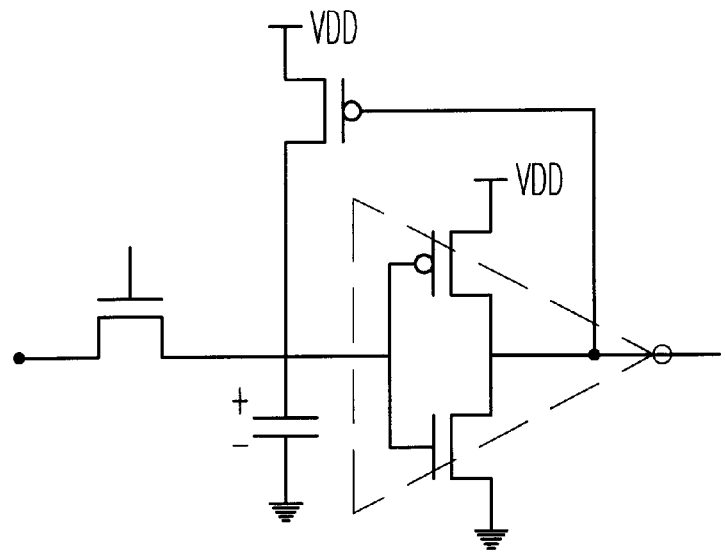
FIG. 6A illustrates a prior art level restore circuits.
Figure 6B:
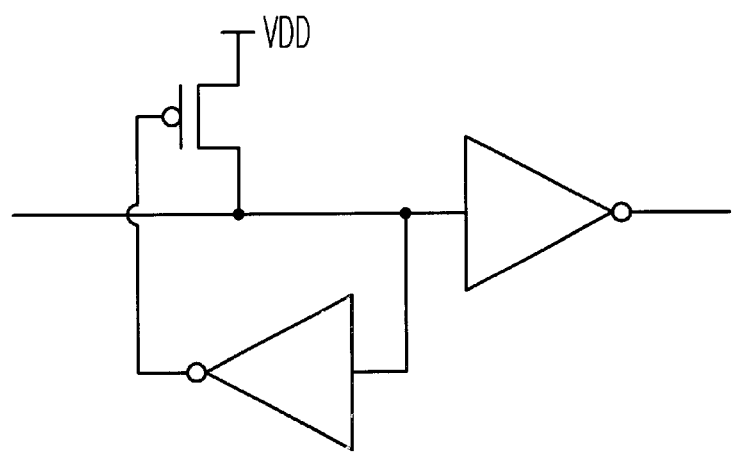
FIG. 6B illustrates another prior art level restore circuit.

FIG. 4B is another characterization of the novel static pass transistor of FIG. 4A. Conductive nodes A, B, C, and D represent the four vertical gates 404-1, 404-2, 404-3, and 404-4. The regions beneath conductive nodes A and B with their zero applied potential can be characterized as "gated," but "on." The region beneath conductive node C with its negative applied potential can be characterized as "gated," and "off." The regions beneath conductive node D with its negative applied potentials can be characterized as "not gated," or "on" since this conductive node is separated from the depletion mode channel by the thicker second oxide thickness. Conductive node D thus functions as a passing line in this embodiment.

As mentioned briefly in the background of the invention, FIGS. 7A, 8A, 9A and 9B illustrate various applications for differential pass transistor logic. In differential pass transistor logic both NMOS and PMOS transistors are used as pass transistors and the threshold voltage drop does not occur, one of these transistor is always on in a high conductivity state. Shown in FIG. 7A is an illustration of differential pass transistor logic in a conventional AND/NAND circuit configuration. One of ordinary skill in the art will understand that the circuit shown in FIG. 7A requires an independent MOSFET gate for each logic input to the integrated circuit. As stated in the background, this requirement consumes valuable chip surface space. In FIG. 7A, a number of input lines, e.g. input lines A B, and a number of complementary input lines, e.g. input lines $\overline{A}$ $\overline{B}$, are provided to the AND/NAND circuit for receiving input signals. A number of complementary output lines, e.g. O $\overline{O}$, provide for output signals from the AND/NAND circuit. Logic input lines provide logic inputs to the gates of the transistors in the AND/NAND circuit array. These logic input lines are shown as logic inputs A, B, and complementary $\overline{A}$, $\overline{B}$, to the gates of the transistors in the array. As shown in FIG. 7A, some of the transistors in the array of transistors are NMOS transistors and some of the transistors are PMOS transistors. The logic input lines thus provide logic inputs A, B, and complementary $\overline{A}$, $\overline{B}$, to the gates of these NMOS and PMOS transistors to achieve the AND/NAND logic function on output lines O and $\overline{O}$. Again, the conventional AND/NAND logic circuit shown in FIG. 7A requires an independent MOSFET transistor for each logic input which quickly exhausts available chip real-estate. FIG. 7B is simply an AND/NAND logic gate symbol representation for the AND/NAND schematic circuit shown in FIG. 7A.

Figure 8A:
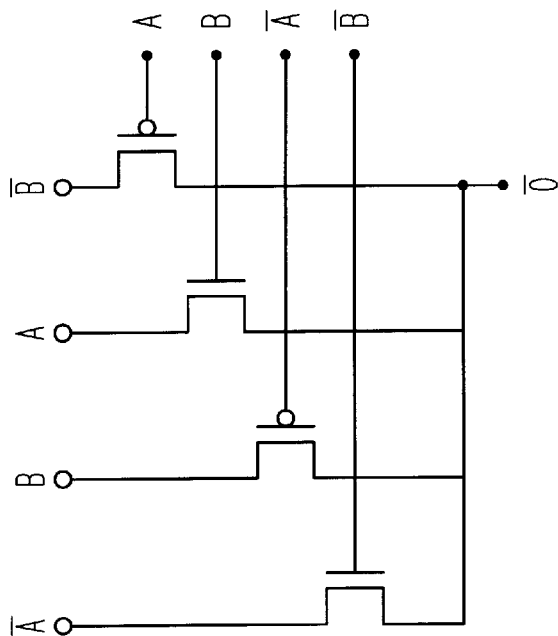
FIG. 8A illustrates another prior art differential pass logic circuit implementation for an XOR/XNOR gate.

Shown in FIG. 8A is an illustration of differential pass transistor logic in a conventional XOR/XNOR circuit configuration. One of ordinary skill in the art will understand that the circuit shown in FIG. 8A requires an independent MOSFET gate for each logic input to the integrated circuit. As stated in the background, this requirement consumes valuable chip surface space. In FIG. 8A, a number of input lines, e.g. input lines A B, and a number of complementary input lines, e.g. input lines $\overline{A}$ $\overline{B}$ input lines, are provided to the XOR/XNOR circuit for receiving input signals. A number of complementary output lines, e.g. O $\overline{O}$, provide for output signals from the XOR/XNOR circuit. Logic input lines provide logic inputs to the gates of the transistors in the XOR/XNOR circuit array. These logic input lines are shown as logic inputs A, B, and complementary $\overline{A}$, $\overline{B}$, to the gates of the transistors in the array. As shown in FIG. 8A, some of the transistors in the array of transistors are NMOS transistors and some of the transistors are PMOS transistors. The logic input lines thus provide logic inputs A, B, and complementary $\overline{A}$, $\overline{B}$, to the gates of these NMOS and PMOS transistors to achieve the XOR/XNOR logic function on output lines O and $\overline{O}$. Again, the conventional XOR/XNOR logic circuit shown in FIG. 8A requires an independent MOSFET transistor for each logic input which quickly exhausts available chip real-estate.

Figure 8B:
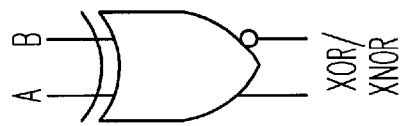
FIG. 8B is a symbol representation for the circuit shown in FIG. 8A.

FIG. 8B is simply an XOR/XNOR logic gate symbol representation for the XOR/XNOR schematic circuit shown in FIG. 8A.

Figure 9A:
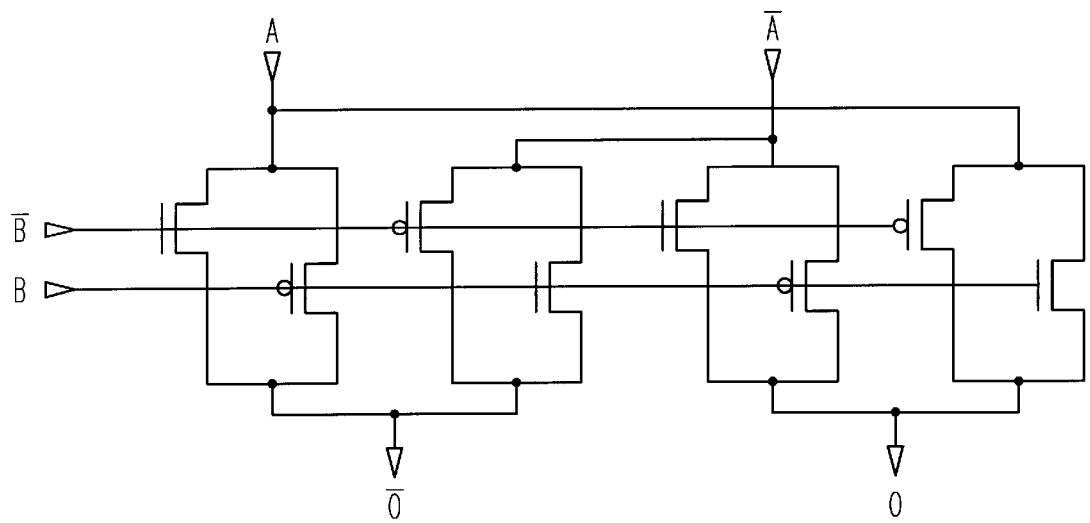
FIG. 9A illustrates another prior art differential pass logic circuit implementation for an XOR gate.

Shown in FIG. 9A is another illustration of differential pass transistor logic in a conventional XOR circuit configuration. One of ordinary skill in the art will understand that the circuit shown in FIG. 9A also requires an independent MOSFET gate for each logic input to the integrated circuit. As stated in the background, this requirement consumes valuable chip surface space. In FIG. 9A, a number of data input lines, e.g. input lines A $\overline{A}$, are provided to the XOR circuit for receiving input signals. A number of complementary output lines, e.g. O $\overline{O}$, provide for output signals from the XOR circuit. Logic input lines provide logic inputs to the gates of the transistors in the XOR circuit array. These logic input lines are shown as logic inputs B and complementary logic input $\overline{B}$, coupled to the gates of the transistors in the array. As shown in FIG. 9A, some of the transistors in the array of transistors are NMOS transistors and some of the transistors are PMOS transistors. The logic input lines thus provide logic inputs B and complementary logic input $\overline{B}$, to the gates of these NMOS and PMOS transistors to achieve the XOR logic function on output lines O and $\overline{O}$. Again, the conventional XOR logic circuit shown in FIG. 9A requires an independent MOSFET transistor for each logic input which quickly exhausts available chip real-estate.

Figure 9B:
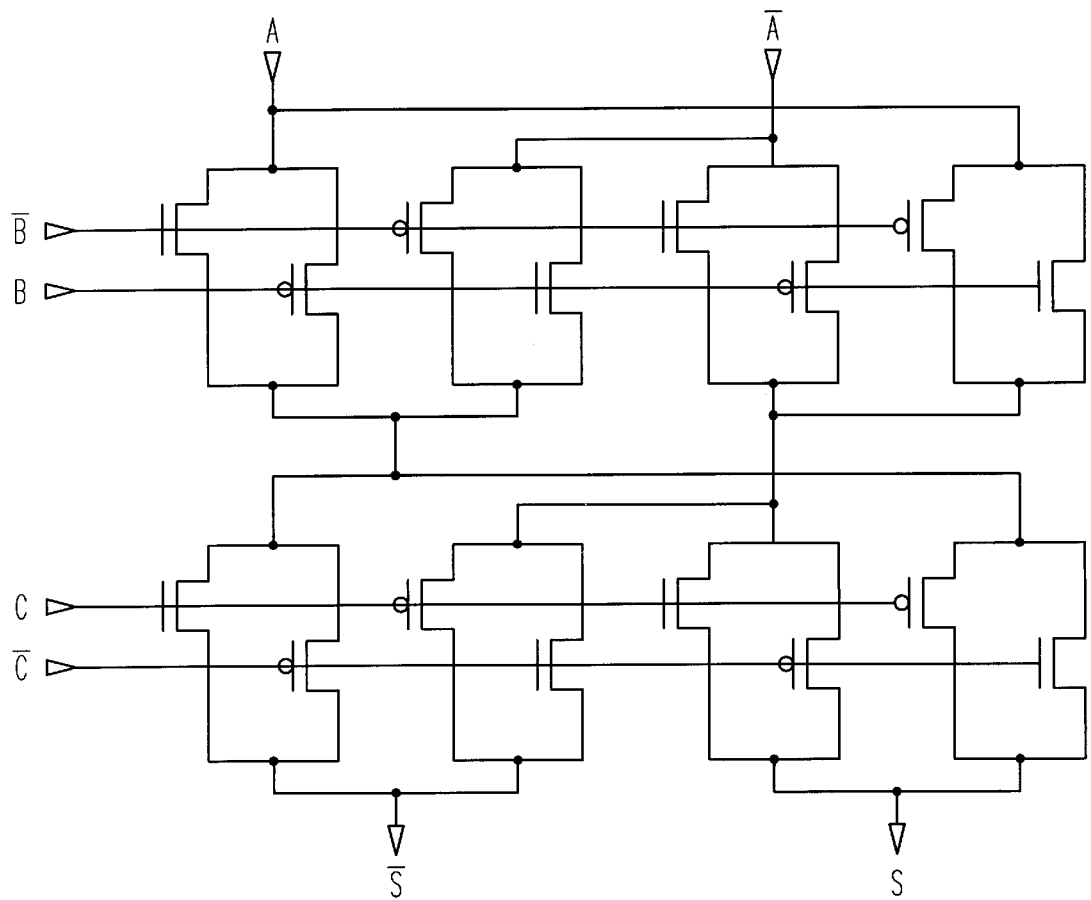
FIG. 9B illustrates another prior art differential pass logic circuit implementation for a one bit full adder, sum circuit.

Shown in FIG. 9B is an illustration of differential pass transistor logic in a conventional one bit full adder, sum circuit configuration. One of ordinary skill in the art will understand that the circuit shown in FIG. 9B requires an independent MOSFET gate for each logic input to the integrated circuit. As stated in the background, this requirement consumes valuable chip surface space. In FIG. 9B, a number of data input lines, e.g. input lines A and $\overline{A}$ are provided to the one bit full adder, sum circuit for receiving input signals. A number of complementary output lines, e.g. S $\overline{S}$, are provide for output signals from the one bit full adder, sum circuit. Logic input lines provide logic inputs to the gates of the transistors in the one bit full adder, sum circuit array. These logic input lines are shown as logic inputs B, C, and complementary logic inputs $\overline{B}$, $\overline{C}$, coupled to the gates of the transistors in the array. As shown in FIG. 9B, some of the transistors in the array of transistors are NMOS transistors and some of the transistors are PMOS transistors. The logic input lines thus provide logic inputs B, C, and complementary logic inputs $\overline{B}$, $\overline{C}$, to the gates of these NMOS and PMOS transistors to achieve the one bit full adder, sum circuit logic function on output lines S and $\overline{S}$. Again, the conventional one bit full adder, sum logic circuit shown in FIG. 9B requires an independent MOSFET transistor for each logic input which quickly exhausts available chip real-estate.

One of ordinary skill in the art will thus understand upon reading this disclosure, the manner in which conventional differential pass transistor logic as applied to integrated circuits quickly exhausts available chip surface space. The conventional need for an independent MOSFET transistor for each logic input further adds to the complexity of such circuits. In contrast, the Applicant's invention addresses and overcomes these shortcomings associated with prior art differential and double pass transistor logic in integrated circuits.

In the Applicant's invention, vertical gate transistors are employed in double-pass pass-transistor logic circuits in a novel architecture to resolve the available surface space dilemma as well as the problems associated with voltage threshold drops, and the complexity involved when needing level restore circuits. The present invention, as described herein, involves array type structures with gate lines crossing over active transistor channels, some lines over thin oxide forming a pass gate and other lines over thicker oxide and being just passing lines. The passing lines exert no control of the transistor channel underneath. The active transistors are formed by having the vertical gate lines over thin gate oxide, these lines can control the conductivity of the channel underneath. For the case of the NMOS devices in the array they would conduct when the gate voltage is most positive, say for instance 1.0 volts in this example, and not conduct when the gate voltage was most negative, in this example −0.6 volts. These arrays also have PMOS devices and the same gate lines cross these devices. The PMOS devices are also depletion mode devices with, say for instance, a threshold voltage of VTP=+0.6 V. In other words a gate to source voltage of +0.6 V must be applied to turn the PMOS device off, it is normally on and conducts strongly with zero gate to source voltage. A negative gate to source voltage such as is normally applied to PMOS devices causes it to conduct even more strongly. These devices would conduct strongly when the gate line voltage is most negative, −0.6 volts and not conduct when the gate line is most positive say for example +1.0 Volt. In this manner novel double-pass pass transistor logic circuits can be constructed in novel architectures using the inventive transistor design having vertical gates. As one of ordinary skill in the art will understand upon reading this disclosure, different voltage levels can be used for the pass variables and the control variables (or logic inputs which drive the gate lines) as presented in connection with the novel circuits described below.

Figure 10:
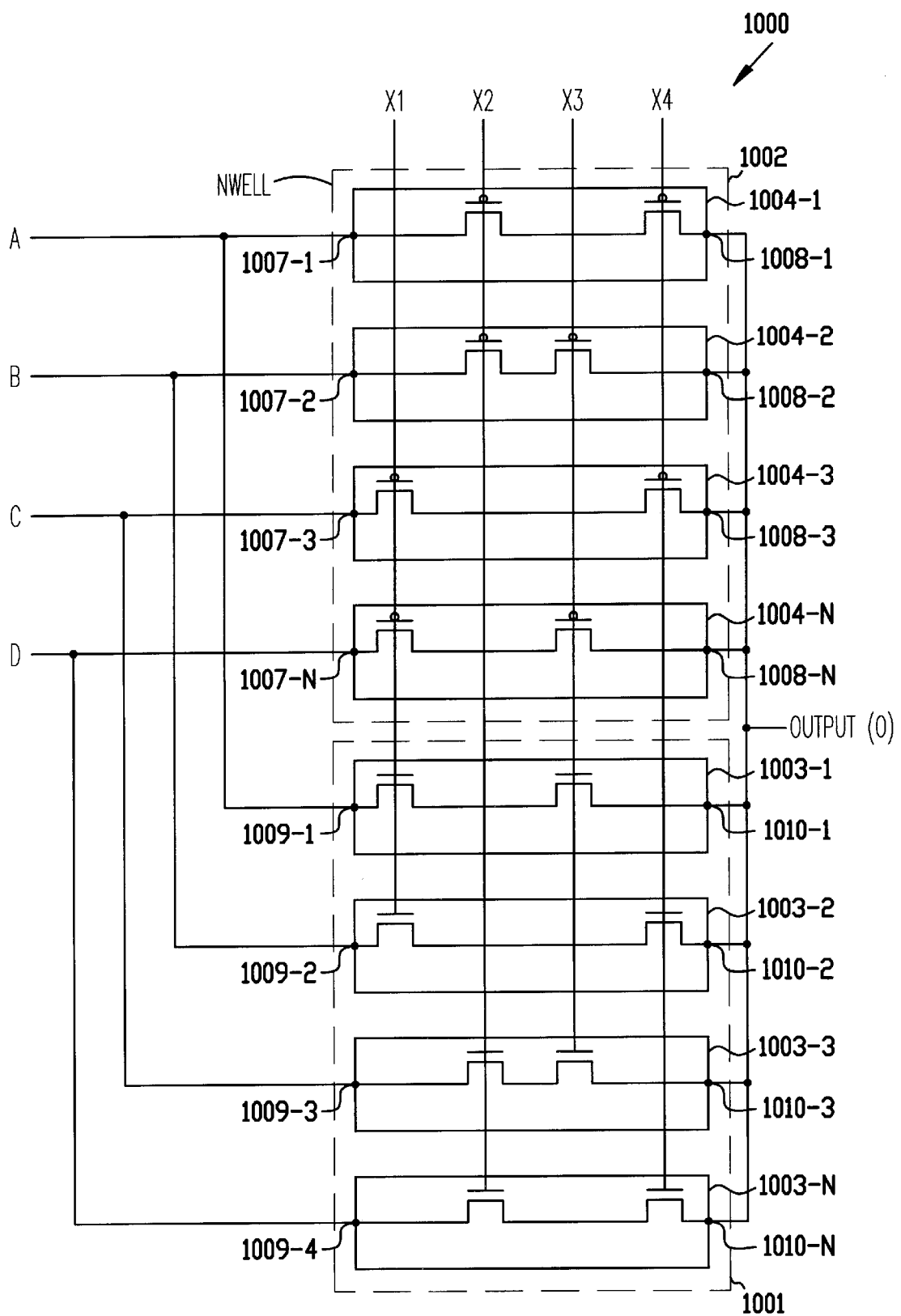
FIG. 10 illustrates an embodiment of a novel integrated circuit 1000 according to the teachings of the present invention.

FIG. 10 illustrates an embodiment of a novel integrated circuit 1000 according to the teachings of the present invention. The novel integrated circuit includes a number of input lines, shown as A, B, C, and D, for receiving input signals. In the embodiment of FIG. 10, at least one output line is provided, shown as output line O, for providing output signals. In this embodiment, one or more arrays of transistors are coupled between the number of input lines, A, B, C, and D, and the at least one output line, O. At least one array, or one sub-group of the array of transistors includes an array of NMOS transistors 1001 and at least one array, or sub-group of the array of transistors includes an array of PMOS transistors 1002. As one of ordinary skill in the art will understand upon reading this disclosure, the array of NMOS transistor 1001 and the array of PMOS transistors 1002 can be formed on a single wafer with the array of PMOS transistors 1002 being formed in an N-well. As shown in FIG. 10, the array of NMOS transistors 1001 includes transistors 1003-1, 1003-2, 1003-3, . . . , 1003-N. As shown in FIG. 10, the array of PMOS transistors 1002 includes transistors 1004-1, 1004-2, 1004-3, 1004-N.

According to the teachings of the present invention, each transistor includes a first source/drain region and a second source/drain region (hereinafter source and drain region respectively for ease of reading) in a horizontal substrate. The source region and the drain region are separated by a depletion mode channel region. In the PMOS array the source regions are noted at 1007-1, 1007-2, 1007-3, . . . , 1007-N and the drain regions are noted at 1008-1, 1008-2, 1008-3, 1008-N. In the NMOS array the source regions are noted at 1009-1, 1009-2, 1009-3, . . . , 1009-N and the drain regions are noted at 1010-1, 1010-2, 1010-3, . . . , 1010-N. A number of vertical gates are located above different portions of the depletion mode channel region for each transistor. According to the teachings of the present invention, at least one of the vertical gates is located above a first portion of the depletion mode channel region and is separated from the channel region by a first thickness insulator material. Further, at least one of the vertical gates is located above a second portion of the channel region and is separated from the channel region by a second thickness insulator material. In the embodiment shown in FIG. 10, the vertical gates which are separated from the depletion mode channel by a first thickness insulator material, or in one embodiment first oxide thickness, are represented by conventional schematic transistor symbols. In the present invention, however, such designation is not intended to represent independent transistors as the single source and drain region for each transistor has already been illustrated with the drawing. Rather, the schematic transistor symbol is provided merely to indicate the active nature of that particular vertical gate as being separated from the horizontal depletion mode channel by the first thickness insulator material. The same will be explained in more detail below. However, the reader should understand that the transistors shown are those structures described and explained in detail in connection with FIGS. 1–4.

The integrated circuit 1000 embodiment shown in FIG. 10 illustrates that the number of input lines, shown as A, B, C, and D, couple to the first source/drain region in each transistor. That is, as shown in FIG. 10, each input line, shown as A, B, C, and D, couples to a pair of first source/drain regions, one of the pair being in the array of NMOS transistors and one of the pair being in the array of PMOS transistors. As shown in the embodiment of FIG. 10, the drain regions 1008-1, 1008-2, 1008-3, 1008-N for the array of PMOS transistors are coupled together to provide a single output at output line O. Further, the drain regions 1010-1, 1010-2, 1010-3, . . . , 1010-N for the array of NMOS transistors are coupled together and coupled to the single output of the array of PMOS transistors to provide a single output at output line O. The number of vertical gates are coupled to a number of gate inputs, gate input lines, or logic input lines, shown in FIG. 10 as X1, X2, X3, and X4. According to the teachings of the present invention, the number of vertical gates are independently coupled to a number of gate input lines, X1, X2, X3, and X4. The number of logic input lines, X1, X2, X3, and X4, shown in FIG. 10, is not intended to be limiting and the reader will appreciate the various combinations of input lines, gate inputs coupled to logic input lines, and number of output lines which can be configured to achieve various logical functions. In other words, the reader will appreciate that the embodiment shown and illustrated in connection with FIG. 10 provide a double pass transistor logic circuit which is a 4 to 1 multiplexor. The reader will further appreciate that the same is provided while conserving precious chip surface space, avoiding the need for level restore circuits, and avoiding threshold voltage loss, all due to the use of the novel transistor configuration implemented in the circuit design. Again, each transistor, or logic cell consists of a single source and drain region separated by a horizontal depletion mode channel and having multiple vertical gates located above and separated from the horizontal depletion mode channel by differing oxide thicknesses.

One of ordinary skill in the art will understand upon reading this disclosure, the manner in which each of the number of vertical gates in each transistor, or logic cell, in the arrays of transistors can be separated from the depletion mode channel by different combinations of the first insulator thickness material and second insulator thickness material in each transistor to achieve a unique placement in each cell in relation to the logic input lines X1, X2, X3, and X4. The same has been described and explained in detail in connection with FIGS. 1–4. As shown in FIG. 10, the number of vertical gates in the array of NMOS transistors are coupled to the identical number of gate inputs coupled to the number of vertical gates for the array of PMOS transistors. Again, in the embodiment shown in FIG. 10, the number of input lines is four for each output line. The same is not intended to be limiting of the invention.

According to the teachings of the present invention, the number of vertical gates, employed herein and described and explained in detail in connection with FIGS. 1–4, each have a horizontal width which has sub-lithographic dimensions. Therefore, the number of vertical gates provide logic inputs such that a minimal surface area in each transistor, or logic cell, is used for each logic input provided on logic input lines X1, X2, X3, and X4. In one embodiment of the present invention, each vertical gate separated from a first portion of the depletion mode channel region by a first thickness insulator material controls conduction in the depletion mode channel, and each vertical separated from a second portion of the depletion mode channel region by a second thickness insulator material has a minimal or no control over conduction in the depletion mode channel. That is the vertical gates separated from the horizontal depletion mode channel by a first thickness insulator material serve as active inputs and the vertical gates separated from the horizontal depletion mode channel by a second thickness insulator material serve as passing gates connected to passing logic input lines. In this embodiment, the first thickness insulator material is less thick than the second thickness insulator material. However, as one of ordinary skill in the art will understand upon reading this disclosure the second thickness insulator material terminology can be used to denote the thinner thickness insulator material in which case the reverse scenario of the above description will apply. The invention is not so limited. What is clear from the present invention is that an arrangement of the vertical gates separated by the first and the second thickness insulator material can be different in each logic cell such that the number of vertical gates provide a number different logic inputs to each logic cell. Thus, a multiplicity of logic functions can be achieved using the present invention. This is further evident in referring to FIG. 11A.

Figure 11A:
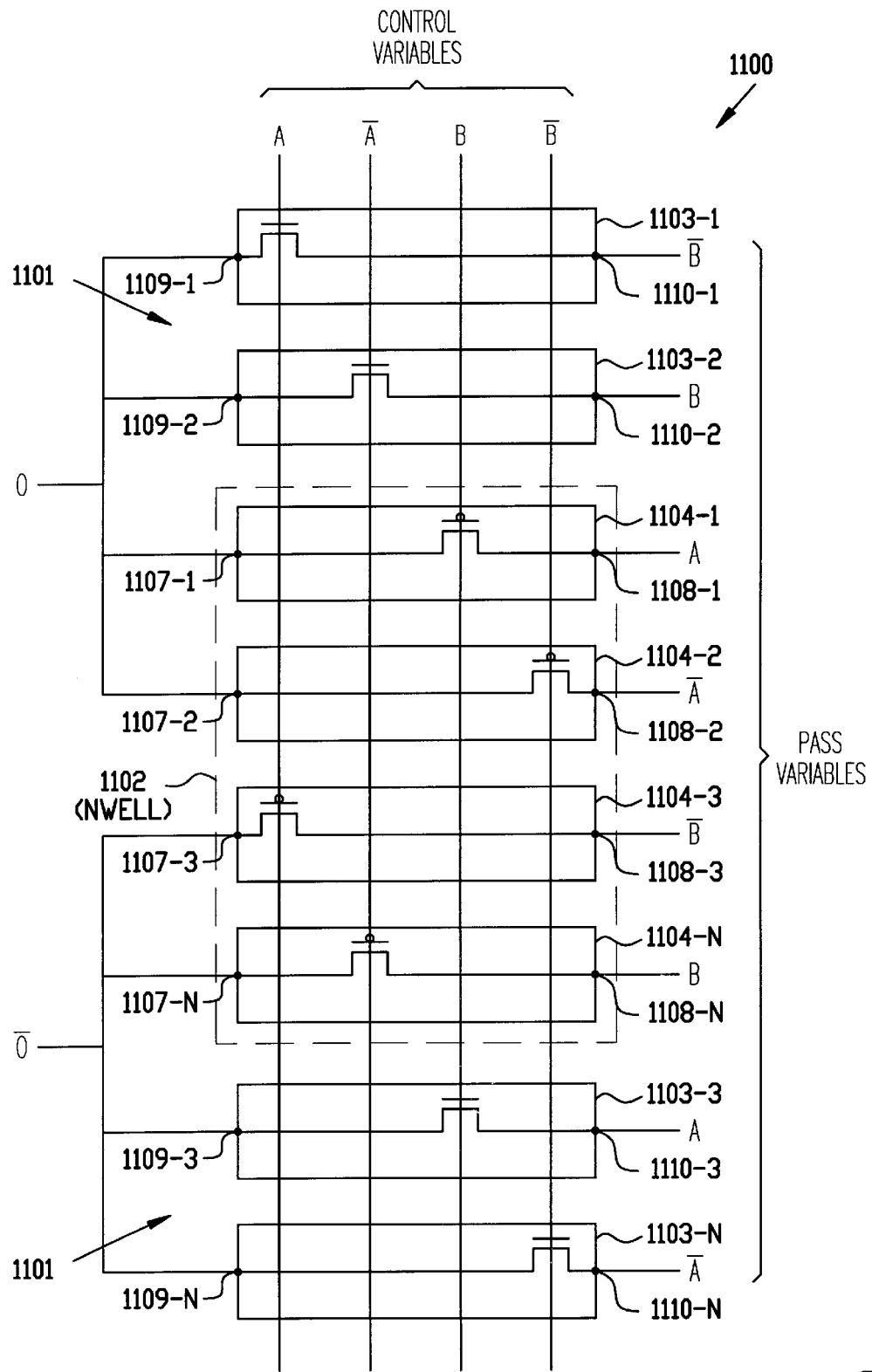
FIG. 11A illustrates another embodiment of an integrated circuit according to the teachings of the present invention.

FIG. 11A illustrates another embodiment of an integrated circuit 1100 according to the teachings of the present invention. FIG. 11A presents a complementary integrated circuit embodiment 1100. FIG. 11A illustrates a complementary pair of output lines, shown in FIG. 11A as O and $\overline{O}$. The complementary integrated circuit embodiment 1100 of FIG. 11A further shows a number of input lines, or pass variables, designated as A, $\overline{A}$, B and $\overline{B}$. In this embodiment, one or more arrays of transistors are coupled between the complementary pair of output lines, O and $\overline{O}$, and the number of input lines, A, $\overline{A}$, B and $\overline{B}$. At least one array, or one sub-group of the array of transistors includes an array of NMOS transistors 1101 and at least one array, or sub-group of the array of transistors includes an array of PMOS transistors 1102. As one of ordinary skill in the art will understand upon reading this disclosure, the array of NMOS transistor 1101 and the array of PMOS transistors 1102 can be formed on a single wafer with the array of PMOS transistors 1102 being formed in an N-well. As shown in FIG. 11A, the array of NMOS transistors 1101 includes transistors 1103-1, 1103-2, 1103-3, . . . , 1103-N. As shown in FIG. 11A, the array of PMOS transistors 1102 includes transistors 1104-1, 1104-2, 1104-3, 1104-N.

According to the teachings of the present invention, each transistor includes a first source/drain region and a second source/drain region (hereinafter source and drain region respectively for ease of reading) in a horizontal substrate. The source region and the drain region are separated by a depletion mode channel region. In the PMOS array the drain regions are noted at 1107-1, 1107-2, 1107-3, . . . , 1107-N and the source regions are noted at 1108-1, 1108-2, 1108-3, 1108-N. In the NMOS array the drain regions are noted at 1109-1, 1109-2, 1109-3, . . . , 1109-N and the source regions are noted at 1110-1, 1110-2, 1110-3, . . . , 1110-N. A number of vertical gates are located above different portions of the depletion mode channel region for each transistor. According to the teachings of the present invention, at least one of the vertical gates is located above a first portion of the depletion mode channel region and is separated from the channel region by a first thickness insulator material. Further, at least one of the vertical gates is located above a second portion of the channel region and is separated from the channel region by a second thickness insulator material. In the embodiment shown in FIG. 11A, the vertical gates which are separated from the depletion mode channel by a first thickness insulator material, or in one embodiment first oxide thickness, are represented by conventional schematic transistor symbols. In the present invention, however, such designation is not intended to represent independent transistors as the single source and drain region for each transistor has already been illustrated with the drawing. Rather, the schematic transistor symbol is provided merely to indicate the active nature of that particular vertical gate as being separated from the horizontal depletion mode channel by the first thickness insulator material. The same will be explained in more detail below. However, the reader should understand that the transistors shown are those structures described and explained in detail in connection with FIGS. 1–4.

The integrated circuit 1100 embodiment shown in FIG. 11A illustrates that the complementary pair of output lines, O and $\overline{O}$, couple to a set of the first source/drain region in each transistor. That is, as shown in FIG. 11A, each complementary output line O or $\overline{O}$, or one of the complementary output lines couples to a first set of first source/drain regions, some of the first source/drain regions being in the array of NMOS transistors and some of the first source/drain regions being in the array of PMOS transistors. The other of the complementary output lines O or $\overline{O}$ is coupled to a first source/drain region for a second set of PMOS transistors and a second set of NMOS transistors. As shown in the embodiment of FIG. 11A, the source regions 1108-1, 1108-2, 1108-3, 1108-N for the array of PMOS transistors couple to the number of input lines, A, $\overline{A}$, B and $\overline{B}$, to provide input signals. Further, the source regions 1110-1, 1110-2, 1110-3, . . . , 1110-N for the array of NMOS transistors couple to a number of different input lines, also shown as A, $\overline{A}$, B and $\overline{B}$, to provide input signals. The number of vertical gates are coupled to a number of gate inputs, gate input lines, control variables, or logic input lines, shown in FIG. 11A as A, $\overline{A}$, B and $\overline{B}$. According to the teachings of the present invention, the number of vertical gates are independently coupled to a number of gate input lines, A, $\overline{A}$, B and $\overline{B}$. The number of logic input lines, A, $\overline{A}$, B and $\overline{B}$, shown in FIG. 11A, is not intended to be limiting and the reader will appreciate the various combinations of complementary output lines (O $\overline{O}$), gate inputs coupled to logic input lines (A, $\overline{A}$ B and $\overline{B}$), and number of input lines (e.g. different , A, $\overline{A}$, B and $\overline{B}$) which can be configured to achieve various logical functions. In other words, the reader will appreciate that the embodiment shown and illustrated in connection with FIG. 11A provides a double pass transistor logic circuit which is a complementary double pass transistor exclusive OR/NOR gate (e.g. XOR/XOR). The reader will further appreciate that the same is provided while conserving precious chip surface space, avoiding the need for level restore circuits, and avoiding threshold voltage loss, all due to the use of the novel transistor configuration implemented in the circuit design. Again, each transistor, or logic cell consists of a single source and drain region separated by a horizontal depletion mode channel and having multiple vertical gates located above and separated from the horizontal depletion mode channel by differing oxide thicknesses.

One of ordinary skill in the art will understand upon reading this disclosure, the manner in which each of the number of vertical gates in each transistor, or logic cell, in the arrays of transistors can be separated from the depletion mode channel by different combinations of the first insulator thickness material and second insulator thickness material in each transistor to achieve a unique placement in each cell in relation to the logic input lines, or control variables A, $\overline{A}$, B and $\overline{B}$. The same has been described and explained in detail in connection with FIGS. 1–4. As shown in FIG. 11A, the number of vertical gates in the array of NMOS transistors are coupled to the identical number of gate inputs coupled to the number of vertical gates for the array of PMOS transistors. In the embodiment shown in FIG. 11A, the number of control variables, A, $\overline{A}$, B and $\overline{B}$, four. The same is not intended to be limiting of the invention.

According to the teachings of the present invention, the number of vertical gates, employed herein and described and explained in detail in connection with FIGS. 1–4, each have a horizontal width which has sub-lithographic dimensions. Therefore, the number of vertical gates provide logic inputs such that a minimal surface area in each transistor, or logic cell, is used for each logic input, or control variable provided on logic input lines A, $\overline{A}$, B and $\overline{B}$. In one embodiment of the present invention, each vertical gate separated from a first portion of the depletion mode channel region by a first thickness insulator material controls conduction in the depletion mode channel, and each vertical separated from a second portion of the depletion mode channel region by a second thickness insulator material has a minimal or no control over conduction in the depletion mode channel. That is, the vertical gates separated from the horizontal depletion mode channel by a first thickness insulator material serve as active inputs and the vertical gates separated from the horizontal depletion mode channel by a second thickness insulator material serve as passing gates connected to passing logic input lines. In this embodiment, the first thickness insulator material is less thick than the second thickness insulator material. However, as one of ordinary skill in the art will understand upon reading this disclosure the second thickness insulator material terminology can be used to denote the thinner thickness insulator material in which case the reverse scenario of the above description will apply. The invention is not so limited. What is clear from the present invention is that an arrangement of the vertical gates separated by the first and the second thickness insulator material can be different in each logic cell such that the number of vertical gates provide a number different logic inputs to each logic cell, or transistor. Thus, a multiplicity of logic functions can be achieved using the present invention.

Figure 11B:
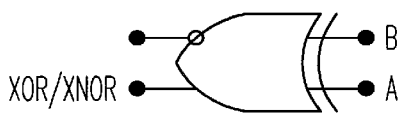
FIG. 11B is a symbol representation for the circuit shown in FIG. 11A.

In one example of the embodiment shown in FIG. 11A the pass variables have voltage levels of 0.0 to 0.4 Volts while the control variables which are the crossing lines have voltage levels of −0.6 and +1.0 Volts. One of ordinary skill in the art will understand upon reading this disclosure, that in the embodiment of FIG. 11A, that most of the gate lines are passing gate lines for any particular transistor, or logic cell. FIG. 11B is a symbol representation for the circuit shown in FIG. 11A.

Figure 12:
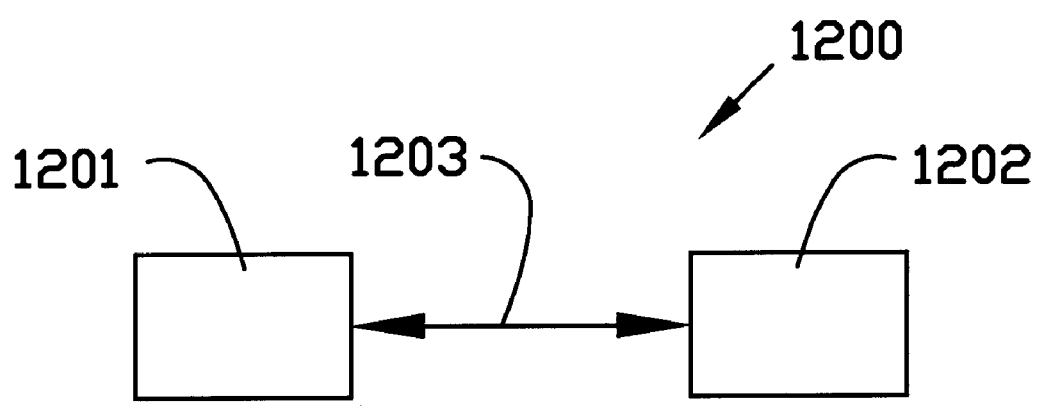
FIG. 12 illustrates a block diagram of an embodiment of an electronic system according to the teachings of the present invention.

FIG. 12 illustrates a block diagram of an embodiment of an electronic system 1200 according to the teachings of the present invention. In the embodiment shown in FIG. 12, the system 1200 includes a processor 1201 which includes a double pass transistor logic circuit. The double pass transistor logic circuit has an array of transistors, or logic cells formed according to the teachings of the present invention. Processor 1201, including double pass transistor logic circuit, is coupled to a memory device 1202 by a bus 1203. In one embodiment, the memory device 1202 and the processor 1201, with its double pass transistor logic circuit formed according to the teachings of the present invention, are located on a single chip.

It will be understood that the embodiment shown in FIG. 12 illustrates an embodiment for electronic system circuitry in which the double pass transistor logic circuits of the present invention are included. One of ordinary skill in the art will understand upon reading this disclosure that the double pass transistor logic circuit of the present invention can equally be used in a variety of applications, the invention is not so limited. The illustration of system 1200, as shown in FIG. 12, is intended to provide a general understanding of one application for the structure and circuitry of the present invention, and is not intended to serve as a complete description of all the elements and features of an electronic system using the novel double pass transistor logic circuits of the present invention.

Applications containing the novel double pass transistor logic circuits of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The Figures presented and described in detail above are similarly useful in describing the method embodiments of operation for a novel double pass transistor logic circuit of the present invention. That is, one embodiment of the present invention includes a method for forming a multiplexor circuit. The method includes forming a number of input lines for receiving input signals. At least one output line is formed for providing output signals. Further, one or more arrays of logic cells are formed coupled between the number of input lines and the at least one output line.

According to the teachings of the present invention, forming each logic cell in the array includes forming a horizontal substrate. The horizontal substrate includes a first source/drain region, a second source/drain region, and a depletion mode channel region separating the first and the second source/drain regions. Forming each logic cell includes forming a number of vertical gates located above different portions of the depletion mode channel region. According to the teachings of the present invention, forming the number of vertical gates includes forming at least one of the vertical gates separated from the channel region by a first thickness insulator material, and forming at least one of the vertical gates separated from the channel region by a second thickness insulator material.

Forming the number of vertical gates further includes forming each vertical gate to have a horizontal width which has sub-lithographic dimensions. In one embodiment, forming the number of vertical gates includes forming each vertical gate to have a horizontal width of approximately 100 nanometers (nm). In one embodiment, the method further including forming the first thickness insulator material to have a thickness of approximately 33 Angstroms (Å), and forming the second thickness insulator material to have a thickness of approximately 330 Angstroms (Å). According to the teachings of the present invention, the method includes forming the number of vertical gates to provide logic inputs such that a minimal area in each logic cell is used for each logic input. The method further including forming at least one array of logic cells to include an array of NMOS transistors and forming at least one array of logic cells to include an array of PMOS transistors.

According to the teachings of the present invention, forming at least one vertical gate separated by a first thickness insulator material from the depletion mode channel region includes forming the at least one vertical gate to control conduction in the depletion mode channel, and forming the at least one vertical gate separated by a second thickness insulator material from the depletion mode channel region includes forming the at least one vertical gate to have a minimal or no control over conduction in the depletion mode channel. In the invention, forming at least one vertical gate separated by a first thickness insulator material from the depletion mode channel region and forming at least one vertical gate separated by a second thickness insulator material from the depletion mode channel region includes forming the number of vertical gates in an arrangement wherein the vertical gates separated by the first and the second thickness insulator material are different in each logic cell such that the number of vertical gates provide a number different logic inputs to each logic cell.

Another embodiment of the present invention includes forming a complementary double pass circuit. The method includes forming a complementary pair of input lines and forming a number of output lines. An array of logic cells are formed including forming a first set of PMOS and NMOS transistor pairs coupled between one of the complementary pair of input lines and a first set of the number of output lines, and including forming a second set of PMOS and NMOS transistor pairs coupled between the other one of the complementary pair of input lines and a second set of the number of output lines.

According to the teachings of the present invention, forming each logic cell in the array of logic cells includes forming a horizontal substrate, wherein the substrate includes a first source/drain region, a second source/drain region, and a depletion mode channel region separates the first and the second source/drain regions. A number of vertical gates are formed located above different portions of the depletion mode channel region. Forming the number of vertical gates includes forming at least one of the vertical gates separated from the depletion mode channel region by a first thickness insulator material and forming at least one of the vertical gates separated from the depletion mode channel region by a second thickness insulator material.

In one embodiment, forming the complementary double pass circuit includes forming an exclusive OR/NOR complementary double pass circuit. Further, forming the complementary double pass circuit includes forming a number of control variable input lines coupled to the number of vertical gates in each transistor. Forming at least one vertical gate separated by a first thickness insulator material includes forming the at least one vertical gate in each logic cell of the first set of PMOS and NMOS transistors to couple to a different control variable input line. Also, forming at least one vertical gate separated by a first thickness insulator material includes forming the at least one vertical gate in each logic cell of the second set of PMOS and NMOS transistors to couple to a different control variable input line.

According to the teachings of the present invention, forming at least one vertical gate separated by a first thickness insulator material includes forming the at least one vertical gate to serve as an active input capable of controlling conduction in the depletion mode channel, and forming at least one of the vertical gate separated by a second thickness insulator material includes forming the at least one vertical gate to serve as a passive gate which has a minimal or no effect on the conduction in the depletion mode channel region. In the invention, forming the number of vertical gates includes forming each of the number of vertical gates to be sub-lithographic in dimension, and wherein forming the number of vertical gates includes forming the number of vertical gates to provide multiple control variable inputs for the logic cells in the array of logic cells.

Another embodiment of the present invention includes a method for operating a multiplexor circuit. The method includes providing a number of input signals on a number of input lines. The method further includes providing a number of control variable signals on a number of gate lines, wherein the number of input lines couple to a source region in one or more arrays of logic cells coupled between the number of input lines and at least one output line. According to the teachings of the present invention, each logic cell includes a horizontal substrate, wherein the substrate includes a first source/drain region, a second source/drain region, and a depletion mode channel region separating the first and the second source/drain regions. Providing a number of control variable signals on a number of gate lines includes providing the number of control variable signals from the number of gate lines to a number of vertical gates located above different portions of the depletion mode channel region, each vertical gate coupled to a gate line. Providing a number of control variable signals from the number of gate lines to a number of vertical gates located above different portions of the depletion mode channel region includes providing the control variable signals to at least one of the vertical gates which is separated from the channel region by a first thickness insulator material, and providing the control variable signals to at least one of the vertical gates which is separated from the channel region by a second thickness insulator material. According to the teachings of the present invention, providing the number of control variable signals on the number of gate lines selectively controls conduction in the number of logic cells depending on whether the gate line couples to a vertical gate separated from the channel by a first or a second thickness insulator material.

In the invention, providing the number of control variable signals on the number of gate lines includes providing a number of logic inputs to each logic cell. Providing a number of control variable signals includes providing the number of control variable signals to a number of vertical gates which have a horizontal width which are sub-lithographic in dimension. Further, providing a number of control variable signals includes providing the number of control variable signals to each logic cell such that a minimal area in each logic cell is used for each logic input.

In the invention, providing a number of control variable signals includes providing the number of control variable signals to an array of NMOS transistors and to an array of PMOS transistors. Also, providing a number of control variable signals includes providing the number of control variable signals to at least one vertical gate separated by a first thickness insulator material from the depletion mode channel region such that the at least one vertical gate to controls conduction in the depletion mode channel, and providing a number of control variable signals includes providing the number of control variable signals to at least one vertical gate separated by a second thickness insulator material from the depletion mode channel region such that the at least one vertical gate to has a minimal or no control over conduction in the depletion mode channel. The method of this embodiment further includes outputting an output signals from the multiplexor based on a sensed conduction in the arrays of logic cells.

Another embodiment of the present invention includes a method for operating a complementary double pass circuit. The method includes providing a number of input signals on a complementary pair of input lines. The method further includes providing a number of control variable signals on a number of gate lines, wherein the complementary pair of input lines couple to a source region in one or more arrays of transistors. One of the complementary pair of input lines couples to a source region for a first set of PMOS and NMOS transistors, and one of the complementary pair of input lines couples to a source region for a second set of PMOS and NMOS transistors. Each transistor in the array of transistors includes a horizontal substrate, which includes a first source/drain region, a second source/drain region, and a depletion mode channel region separating the first and the second source/drain regions. A number of vertical gates are located above different portions of the depletion mode channel region, each vertical gate coupled to a gate line for receiving the control variable signals. At least one of the vertical gates is separated from the channel region by a first thickness insulator material and at least one of the vertical gates is separated from the channel region by a second thickness insulator material. According to the teachings of the present invention, providing the number of control variable signals on the number of gate lines selectively controls conduction in the number of transistors depending on whether the gate line couples to a vertical gate separated from the depletion mode channel by a first or a second thickness insulator material.

In the present invention, providing the number of control variable signals on the number of gate lines includes providing a number of logic inputs to each transistor. Operating the complementary double pass circuit further includes outputting a number of pass variables on a number of output lines based on conduction through the depletion mode channels in array of transistors. In one embodiment, providing a number of control variable signals on the number of gate lines includes applying a negative potential of approximately −0.6 Volts to at least one of the number of vertical gates such that the at least one vertical gate turns off conduction in the depletion mode channel. Also, providing a number of control variable signals on the number of gate lines includes applying a potential to a number of vertical gates which serve as passing lines. According to the teachings of the present invention, providing a number of control variable signals on the number of gate lines includes independently applying potential values to the number of vertical gates. Thus, providing a number of control variable signals on the number of gate lines includes using at least one of the number of vertical gates in any transistor as a passing line includes and using at least one of the number of vertical gates in any transistor as an active input.

In the invention, providing a number of control variable signals on the number of gate lines includes providing a number of control variable signals to a number of edge defined vertical gates which have a horizontal width which is sub-lithographic in dimension. And, providing a number of control variable signals includes providing an number of logic inputs to each transistor such that less than one MOSFET is used for each logic input to the complementary double pass circuit.

Conclusion

Thus, the present invention provides systems and methods for double pass transistor logic with vertical gate transistors. The vertical gate transistors have multiple vertical gates which are edge defined such that only a single transistor is required for multiple logic inputs. According to the present invention, there is no source nor drain region associated with each input and the gates have sub-lithographic horizontal dimensions by virtue of being edge defined vertical gates. Thus, a minimal surface area is required for each logic input. The integrated circuits presented in connection with the present invention conserve precious chip surface space, avoid the need for level restore circuits, and avoid threshold voltage loss, all due to the use of the novel transistor configuration implemented in the circuit design. Again, each transistor, or logic cell consists of a single source and drain region separated by a horizontal depletion mode channel and having multiple vertical gates located above and separated from the horizontal depletion mode channel by differing oxide thicknesses.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An integrated circuit, comprising:
    a number of input lines for receiving input signals;
    at least one output line for providing output signals; and
    one or more arrays of transistors coupled between the number of input lines and the at least one output line, wherein each transistor includes:
        a source region in a horizontal substrate;
        a drain region in the horizontal substrate;
        a depletion mode channel region separating the source and the drain regions;
        a number of vertical gates located above different portions of the depletion mode channel region;
        wherein at least one of the vertical gates is located above a first portion of the depletion mode channel region and is separated from the channel region by a first thickness insulator material; and
        wherein at least one of the vertical gates is located above a second portion of the channel region and is separated from the channel region by a second thickness insulator material.

2. The integrated circuit of claim 1, wherein at least one array of transistors includes an array of NMOS transistors and at least one array of transistors includes an array of PMOS transistors.

3. The integrated circuit of claim 1, including at least one array of PMOS transistors, wherein each PMOS transistor is coupled to a different input line at the source region, wherein the drain regions for the array of PMOS transistors are coupled together to provide a single output, and wherein the number of vertical gates are coupled to a number of gate inputs.

4. The integrated circuit of claim 3, wherein the number of vertical gates in each of the array of PMOS transistors are separated from the depletion mode channel by different combinations of the first insulator thickness material and second insulator thickness material in each transistor.

5. The integrated circuit of claim 3, including at least one array of NMOS transistors, where each NMOS transistor is coupled to a different input line at the source region, wherein each input line couple to a source region of a PMOS transistor in the PMOS array is similarly coupled to one of the NMOS transistors in the NMOS array, and wherein the drain regions for the array of NMOS transistors are coupled together and coupled to the single output of the array of PMOS transistors.

6. The integrated circuit of claim 5, wherein the number of vertical gates in the array of NMOS transistors are coupled to the identical number of gate inputs coupled to the number of vertical gates for the array of PMOS transistors.

7. The integrated circuit of claim 1, wherein the number of input lines is four for each output line.

8. A double pass circuit, comprising:
    a number of input lines for receiving input signals;
    at least one output line for providing output signals; and
    one or more arrays of transistors coupled between the number of input lines and the at least one output line, wherein each transistor includes:
        a horizontal substrate, wherein the substrate includes a first source/drain region, a second source/drain region, and a depletion mode channel region separating the first and the second source/drain regions;
        a number of vertical gates located above different portions of the depletion mode channel region;
        wherein at least one of the vertical gates is located above a first portion of the depletion mode channel region and is separated from the channel region by a first thickness insulator material; and
        wherein at least one of the vertical gates is located above a second portion of the channel region and is separated from the channel region by a second thickness insulator material.

9. The double pass circuit of claim 8, wherein at least one array of transistors includes an array of NMOS transistors and at least one array of transistors includes an array of PMOS transistors.

10. The double pass circuit of claim 9, wherein the number of input lines couple to the first source/drain region in each transistor, and wherein each input line couples couples to a pair of first source/drain regions one of the pair being in the array of NMOS transistors and one of the pair being in the array of PMOS transistors.

11. The double pass circuit of claim 9, wherein the second source/drain regions for the transistors are coupled together to provide a single output.

12. The double pass circuit of claim 9, wherein the number of vertical gates are independently coupled to a number of gate input lines.

13. The double pass circuit of claim 8, wherein the double pass circuit comprises a multiplexor.

14. The double pass circuit of claim 8, wherein the number of vertical gates each have a horizontal width of approximately 100 nanometers (nm).

15. The double pass circuit of claim 8, wherein the first thickness insulator material is approximately 33 Angstroms (Å), and wherein the second thickness insulator material is approximately 330 Angstroms (Å).

16. A multiplexor circuit, comprising:
a number of input lines for receiving input signals;
at least one output line for providing output signals; and
one or more arrays of logic cells coupled between the number of input lines and the at least one output line, wherein each logic cell includes:
a horizontal substrate, wherein the substrate includes a first source/drain region, a second source/drain region, and a depletion mode channel region separating the first and the second source/drain regions;
a number of vertical gates located above different portions of the depletion mode channel region;
wherein at least one of the vertical gates is located above a first portion of the depletion mode channel region and is separated from the channel region by a first thickness insulator material; and
wherein at least one of the vertical gates is located above a second portion of the channel region and is separated from the channel region by a second thickness insulator material.

17. The multiplexor of claim 16, wherein the number of vertical gates each have horizontal width which has sub-lithographic dimensions.

18. The multiplexor of claim 17, wherein the number of vertical gates provide logic inputs such that a minimal area in each logic cell is used for each logic input.

19. The multiplexor of claim 16, wherein at least one array of logic cells includes an array of NMOS transistors and at least one array of logic cells includes an array of PMOS transistors.

20. The multiplexor of claim 16, wherein each vertical gate separated from a first portion of the depletion mode channel region by a first thickness insulator material controls conduction in the depletion mode channel, and wherein each vertical separated from a second portion of the depletion mode channel region by a second thickness insulator material has a minimal or no control over conduction in the depletion mode channel.

21. The multiplexor of claim 16, wherein each array of logic cells includes a number of vertical gates separated from the channel region by a first thickness insulator material and a number of gates separated from the channel region by a second thickness insulator material, and wherein an arrangement of the gates separated by the first and the second thickness insulator material is different in each logic cell such that the number of vertical gates provide a number different logic inputs to each logic cell.

22. A complementary integrated circuit, comprising:
a complementary pair of output lines;
a number of input lines; and
an array of transistors coupled between the complementary pair of output lines and the number of input lines, wherein each transistor in the array of transistors includes;
a source region in a horizontal substrate;
a drain region in the horizontal substrate;
a depletion mode channel region separating the source and the drain regions;
a number of vertical gates located above different portions of the depletion mode channel region;
wherein at least one of the vertical gates is located above a first portion of the depletion mode channel region and is separated from the channel region by a first thickness insulator material; and
wherein at least one of the vertical gates is located above a second portion of the channel region and is separated from the channel region by a second thickness insulator material.

23. The complementary integrated circuit of claim 22, wherein a number of the transistors in the array of transistors include PMOS transistors and a number of transistors in the array of transistors include NMOS transistors.

24. The complementary integrated circuit of claim 23, wherein one of the complementary pair of output lines is coupled to a drain region for a first set of PMOS transistors and a first set of NMOS transistors, and wherein one of the complementary pair of output lines is coupled to a drain region for a second set of PMOS transistors and a second set of NMOS transistors.

25. The complementary integrated circuit of claim 22, wherein the number of vertical gates in each transistor are coupled to a number of control variable input lines.

26. The complementary integrated circuit of claim 22, wherein the at least one vertical gate separated from the channel region by a first thickness insulator material is able to control conduction within the depletion mode channel and serves as an active logic input, and wherein the at least one vertical gate separated from the channel region by a second thickness insulator material has a minimal or no ability to control conduction in the channel and serves as a passing line.

27. The complementary integrated circuit of claim 22, wherein the first oxide thickness is less than 50 Angstroms (Å).

28. The complementary integrated circuit of claim 22, wherein the second oxide thickness is less than 300 Angstroms (Å).

29. The complementary integrated circuit of claim 22, wherein the depletion mode channel region separating the source and the drain regions is controlled by a potential range of less than 0.5 Volts applied to at least one of the number of vertical gates.

30. A complementary double pass circuit, comprising:
a complementary pair of output lines;
a number of input lines; and
an array of transistors coupled between the complementary pair of output lines and the number of input lines, wherein each transistor in the array of transistors includes;
a horizontal substrate, wherein the substrate includes a first source/drain region, a second source/drain region, and a depletion mode channel region separating the first and the second source/drain regions;
a number of vertical gates located above different portions of the depletion mode channel region;
wherein at least one of the vertical gates is located above a first portion of the depletion mode channel region and is separated from the channel region by a first thickness insulator material; and
wherein at least one of the vertical gates is located above a second portion of the channel region and is separated from the channel region by a second thickness insulator material.

31. The complementary double pass circuit of claim 30, wherein the array transistors includes a set of PMOS transistors and a set of NMOS.

32. The complementary double pass circuit of claim 30, wherein the circuit further includes a number of control variable input lines coupled to the number of vertical gates in each transistor.

33. The complementary double pass circuit of claim 31, wherein the at least one vertical gate separated from the depletion mode channel by a first thickness insulator material is able to control conduction in the depletion mode channel, and wherein the at least one vertical gate separated from the depletion mode channel by a first oxide thickness is coupled to a different one of the number of control variable input lines in different transistors in the array of transistors.

34. The complementary double pass circuit of claim 30, wherein the first thickness insulator material includes an oxide having a thickness of less than 50 Angstroms, and wherein the second thickness insulator material includes an oxide having a thickness of less than 350 Angstroms.

35. The complementary double pass circuit of claim 30, wherein the number of vertical gates each are sub-lithographic in dimension, and wherein the number of vertical gates provide multiple control variable inputs for the transistors in the array of transistors.

36. The complementary double pass circuit of claim 30, wherein the number of input lines include a number of pass variables.

37. The complementary double pass circuit of claim 30, wherein the circuit includes an exclusive OR/NOR circuit.

38. A complementary double pass circuit, comprising:
a complementary pair of output lines;
a number of input lines; and
an array of logic cells including a first set of PMOS and NMOS transistor pairs coupled between one of the complementary pair of output lines and a first set of the number of input lines, and including a second set of PMOS and NMOS transistor pairs coupled between the other one of the complementary pair of output lines and a second set of the number of input lines, wherein each logic cell in the array of logic cells includes;
a horizontal substrate, wherein the substrate includes a first source/drain region, a second source/drain region, and a depletion mode channel region separating the first and the second source/drain regions;
a number of vertical gates located above different portions of the depletion mode channel region;
wherein at least one of the vertical gates is separated from the depletion mode channel region by a first thickness insulator material; and
wherein at least one of the vertical gates is separated from the depletion mode channel region by a second thickness insulator material.

39. The complementary double pass circuit of claim 38, wherein the circuit includes an exclusive OR/NOR circuit.

40. The complementary double pass circuit of claim 38, wherein the circuit further includes a number of control variable input lines coupled to the number of vertical gates in each transistor.

41. The complementary double pass circuit of claim 40, wherein the at least one vertical gate separated by a first thickness insulator material is arranged in each logic cell of the first set of PMOS and NMOS transistors to couple to a different control variable input line.

42. The complementary double pass circuit of claim 41, wherein the at least one vertical gate separated by a first thickness insulator material is arranged in each logic cell of the second set of PMOS and NMOS transistors to couple to a different control variable input line.

43. The complementary double pass circuit of claim 38, wherein in the at least one of the vertical gates separated from the depletion mode channel region by a first thickness insulator material serves as an active input capable of controlling conduction in the depletion mode channel, and wherein at least one of the vertical gates is separated from the depletion mode channel region by a second thickness insulator material serves as a passive gate which has a minimal or no effect on the conduction in the depletion mode channel region.

44. The complementary double pass circuit of claim 38, wherein the number of vertical gates each are sub-lithographic in dimension, and wherein the number of vertical gates provide multiple control variable inputs for the transistors in the array of transistors.

45. An electronic system, comprising:
a memory device; and
a processor coupled to the memory device, wherein the processor includes an integrated circuit, comprising:
a number of input lines for receiving input signals;
at least one output line for providing output signals; and
one or more arrays of transistors coupled between the number of input lines and the at least one output line, wherein each transistor includes:
a source region in a horizontal substrate;
a drain region in the horizontal substrate;
a depletion mode channel region separating the source and the drain regions;
a number of vertical gates located above different portions of the depletion mode channel region;
wherein at least one of the vertical gates is located above a first portion of the depletion mode channel region and is separated from the channel region by a first thickness insulator material; and
wherein at least one of the vertical gates is located above a second portion of the channel region and is separated from the channel region by a second thickness insulator material.

46. The electronic system of claim 45, wherein at least one array of transistors includes an array of NMOS transistors and at least one array of transistors includes an array of PMOS transistors.

47. The electronic system of claim 46, wherein the number of input lines couple to the source region in each transistor, and wherein each input line couples couples to a pair of source regions one of the pair being in the array of NMOS transistors and one of the pair being in the array of PMOS transistors.

48. The electronic system of claim 45, wherein the drain regions for the transistors are coupled together to provide a single output.

49. The electronic system of claim 45, wherein the number of vertical gates are independently coupled to a number of gate input lines.

50. The electronic system of claim 45, wherein the integrated circuit comprises a double pass multiplexor circuit.

51. The electronic system of claim 45, wherein the number of vertical gates each have a horizontal width of approximately 100 nanometers (nm).

52. The electronic system of claim 45, wherein the first thickness insulator material is approximately 33 Angstroms (Å), and wherein the second thickness insulator material is approximately 330 Angstroms (Å).

53. An electronic system, comprising:
a memory device; and
a processor coupled to the memory device, wherein the processor includes a multiplexor circuit, the multiplexor circuit comprising:
a number of input lines for receiving input signals;
at least one output line for providing output signals; and
one or more arrays of logic cells coupled between the number of input lines and the at least one output line, wherein each logic cell includes:
a horizontal substrate, wherein the substrate includes a first source/drain region, a second source/drain region, and a depletion mode channel region separating the first and the second source/drain regions;
a number of vertical gates located above different portions of the depletion mode channel region;
wherein at least one of the vertical gates is separated from the channel region by a first thickness insulator material; and
wherein at least one of the vertical gates is separated from the channel region by a second thickness insulator material.

54. The electronic system of claim 53, wherein the number of vertical gates each have a horizontal width which has sub-lithographic dimensions.

55. The electronic system of claim 53, wherein the number of vertical gates provide logic inputs such that a minimal area in each logic cell is used for each logic input.

56. The electronic system of claim 53, wherein at least one array of logic cells includes an array of NMOS transistors and at least one array of logic cells includes an array of PMOS transistors.

57. The electronic system of claim 53, wherein each vertical gate separated from a first portion of the depletion mode channel region by a first thickness insulator material controls conduction in the depletion mode channel, and wherein each vertical separated from a second portion of the depletion mode channel region by a second thickness insulator material has a minimal or no control over conduction in the depletion mode channel.

58. The electronic system of claim 53, wherein each array of logic cells includes a number of vertical gates separated from the channel region by a first thickness insulator material and a number of gates separated from the channel region by a second thickness insulator material, and wherein an arrangement of the gates separated by the first and the second thickness insulator material is different in each logic cell such that the number of vertical gates provide a number different logic inputs to each logic cell.

59. An electronic system, comprising:
a memory device; and
a processor coupled to the memory device, wherein the processor includes a complementary double pass circuit, the complementary double pass circuit comprising:
a complementary pair of output lines;
a number of input lines; and
an array of transistors coupled between the complementary pair of output lines and the number of input lines, wherein each transistor in the array of transistors includes;
a horizontal substrate, wherein the substrate includes a first source/drain region, a second source/drain region, and a depletion mode channel region separating the first and the second source/drain regions;
a number of vertical gates located above different portions of the depletion mode channel region;
wherein at least one of the vertical gates is separated from the channel region by a first thickness insulator material; and
wherein at least one of the vertical gates is separated from the channel region by a second thickness insulator material.

60. The electronic system of claim 59, wherein the depletion mode channel region separating the source and the drain regions is controlled by a potential range of less than 0.5 Volts applied to at least one of the number of vertical gates.

61. The electronic system of claim 59, wherein the array of transistors includes a set of PMOS transistors and a set of NMOS.

62. The electronic system of claim 59, wherein the complementary double pass circuit further includes a number of control variable input lines coupled to the number of vertical gates in each transistor.

63. The electronic system of claim 62, wherein the at least one vertical gate separated from the depletion mode channel by a first thickness insulator material is able to control conduction in the depletion mode channel, and wherein the at least one vertical gate separated from the depletion mode channel by the first thickness insulator material is coupled to a different one of the number of control variable input lines in different transistors in the array of transistors.

64. The electronic system of claim 59, wherein the first thickness insulator material includes an oxide having a thickness of less than 50 Angstroms, and wherein the second thickness insulator material includes an oxide having a thickness of less than 350 Angstroms.

65. The electronic system of claim 59, wherein the number of vertical gates each are sub-lithographic in dimension, and wherein the number of vertical gates provide multiple control variable inputs for the transistors in the array of transistors.

66. The electronic system of claim 59, wherein the complementary double pass circuit includes an exclusive OR/NOR circuit, and wherein the number of input lines include a number of pass variables.

67. An electronic system, comprising:
a memory device; and
a processor coupled to the memory device, wherein the processor includes a complementary double pass circuit, the complementary double pass circuit comprising:
a complementary pair of output lines;
a number of input lines; and
an array of logic cells including a first set of PMOS and NMOS transistor pairs coupled between one of the complementary pair of output lines and a first set of the number of input lines, and including a second set of PMOS and NMOS transistor pairs coupled between the other one of the complementary pair of output lines and a second set of the number of input lines, wherein each logic cell in the array of logic cells includes;
  a horizontal substrate, wherein the substrate includes a first source/drain region, a second source/drain region, and a depletion mode channel region separating the first and the second source/drain regions;
  a number of vertical gates located above different portions of the depletion mode channel region;
  wherein at least one of the vertical gates is separated from the depletion mode channel region by a first thickness insulator material; and
  wherein at least one of the vertical gates is separated from the depletion mode channel region by a second thickness insulator material.

68. The electronic system of claim 67, wherein the complementary double pass circuit includes an exclusive OR/NOR circuit.

69. The electronic system of claim 67, wherein the complementary double pass circuit further includes a number of control variable input lines coupled to the number of vertical gates in each logic cell.

70. The electronic system of claim 69, wherein the at least one vertical gate separated by a first thickness insulator material is arranged in each logic cell of the first set of PMOS and NMOS transistors to couple to a different control variable input line.

71. The electronic system of claim 70, wherein the at least one vertical gate separated by a first thickness insulator material is arranged in each logic cell of the second set of PMOS and NMOS transistors to couple to a different control variable input line.

72. The electronic system of claim 69, wherein the at least one of the vertical gates separated from the depletion mode channel region by a first thickness insulator material serves as an active input capable of controlling conduction in the depletion mode channel, and wherein the at least one of the vertical gates is separated from the depletion mode channel region by a second thickness insulator material serves as a passive gate which has a minimal or no effect on the conduction in the depletion mode channel region.

73. The electronic system of claim 69, wherein the number of vertical gates each are sub-lithographic in dimension, and wherein the number of vertical gates provide multiple control variable inputs for the logic cells in the array of logic cells.

74. A method for forming a multiplexor circuit, comprising:
  forming a number of input lines for receiving input signals;
  forming at least one output line for providing output signals; and
  forming one or more arrays of logic cells coupled between the number of input lines and the at least one output line, wherein forming each logic cell includes:
    forming a horizontal substrate, wherein the substrate includes a first source/drain region, a second source/drain region, and a depletion mode channel region separating the first and the second source/drain regions;
    forming a number of vertical gates located above different portions of the depletion mode channel region;
    wherein forming the number of vertical gates includes forming at least one of the vertical gates separated from the channel region by a first thickness insulator material; and
    wherein forming the number of vertical gates includes forming at least one of the vertical gates separated from the channel region by a second thickness insulator material.

75. The method of claim 74, wherein forming the number of vertical gates includes forming each vertical gate to have a horizontal width which has sub-lithographic dimensions.

76. The method of claim 74, wherein forming the number of vertical gates includes forming each vertical gate to have a horizontal width of approximately 100 nanometers (nm).

77. The method of claim 74, the method further including forming the first thickness insulator material to have a thickness of approximately 33 Angstroms (Å), and forming the second thickness insulator material to have a thickness of approximately 330 Angstroms (Å).

78. The method of claim 74, the method further including forming the number of vertical gates to provide logic inputs such that a minimal area in each logic cell is used for each logic input.

79. The method of claim 74, the method further including forming at least one array of logic cells to include an array of NMOS transistors and forming at least one array of logic cells to include an array of PMOS transistors.

80. The method of claim 74, wherein forming at least one vertical gate separated by a first thickness insulator material from the depletion mode channel region includes forming the at least one vertical gate to control conduction in the depletion mode channel, and wherein forming the at least one vertical gate separated by a second thickness insulator material from the depletion mode channel region includes forming the at least one vertical gate to have a minimal or no control over conduction in the depletion mode channel.

81. The method of claim 74, wherein forming at least one vertical gate separated by a first thickness insulator material from the depletion mode channel region and forming at least one vertical gate separated by a second thickness insulator material from the depletion mode channel region includes forming the number of vertical gates in an arrangement wherein the gates separated by the first and the second thickness insulator material are different in each logic cell such that the number of vertical gates provide a number different logic inputs to each logic cell.

82. A method for forming a complementary double pass circuit, comprising:
  forming a complementary pair of output lines;
  forming a number of input lines; and
  forming an array of logic cells including forming a first set of PMOS and NMOS transistor pairs coupled between one of the complementary pair of output lines and a first set of the number of input lines, and including forming a second set of PMOS and NMOS transistor pairs coupled between the other one of the complementary pair of output lines and a second set of the number of input lines, wherein forming each logic cell in the array of logic cells includes;
    forming a horizontal substrate, wherein the substrate includes a first source/drain region, a second source/drain region, and a depletion mode channel region separating the first and the second source/drain regions;
    forming a number of vertical gates located above different portions of the depletion mode channel region;
    wherein forming a number of vertical gates includes forming at least one of the vertical gates separated from the depletion mode channel region by a first thickness insulator material; and wherein forming a number of vertical gates includes forming at least one of the vertical gates separated from the depletion mode channel region by a second thickness insulator material.

83. The method of claim 82, wherein forming the complementary double pass circuit includes forming an exclusive OR/NOR complementary double pass circuit.

84. The method of claim 82, wherein forming the complementary double pass circuit includes forming a number of control variable input lines coupled to the number of vertical gates in each transistor.

85. The method of claim 82, wherein forming at least one vertical gate separated by a first thickness insulator material includes forming the at least one vertical gate in each logic cell of the first set of PMOS and NMOS transistors to couple to a different control variable input line.

86. The method of claim 85, wherein forming at least one vertical gate separated by a first thickness insulator material includes forming the at least one vertical gate in each logic cell of the second set of PMOS and NMOS transistors to couple to a different control variable input line.

87. The method of claim 85, wherein forming at least one vertical gate separated by a first thickness insulator material includes forming the at least one vertical gate to serve as an active input capable of controlling conduction in the depletion mode channel, and wherein forming at least one of the vertical gate separated by a second thickness insulator material includes forming the at least one vertical gate to serve as a passive gate which has a minimal or no effect on the conduction in the depletion mode channel region.

88. The method of claim 85, wherein forming the number of vertical gates includes forming each of the number of vertical gates to be sub-lithographic in dimension, and wherein forming the number of vertical gates includes forming the number of vertical gates to provide multiple control variable inputs for the logic cells in the array of logic cells.

89. A method for operating a multiplexor circuit, comprising:
    providing a number of input signals on a number of input lines;
    providing a number of control variable signals on a number of gate lines, wherein the number of input lines couple to a source region in one or more arrays of logic cells coupled between the number of input lines and at least one output line, and wherein each logic cell includes:
        a horizontal substrate, wherein the substrate includes a first source/drain region, a second source/drain region, and a depletion mode channel region separating the first and the second source/drain regions;
        a number of vertical gates located above different portions of the depletion mode channel region, each vertical gate coupled to a gate line;
        wherein at least one of the vertical gates separated from the channel region by a first thickness insulator material; and
        wherein at least one of the vertical gates separated from the channel region by a second thickness insulator material; and
    wherein providing the number of control variable signals on the number of gate lines selectively controls conduction in the number of logic cells depending on whether the gate line couples to a vertical gate separated from the channel by a first or a second thickness insulator material.

90. The method of claim 89, wherein providing the number of control variable signals on the number of gate lines includes providing a number of logic inputs to each logic cell.

91. The method of claim 89, wherein providing a number of control variable signals includes providing the number of control variable signals to a number of vertical gates which have a horizontal width which are sub-lithographic in dimension.

92. The method of claim 89, wherein providing a number of control variable signals includes providing the number of control variable signals to each logic cell such that a minimal area in each logic cell is used for each logic input.

93. The method of claim 89, wherein providing a number of control variable signals includes providing the number of control variable signals to an array of NMOS transistors and to an array of PMOS transistors.

94. The method of claim 89, wherein providing a number of control variable signals includes providing the number of control variable signals to at least one vertical gate separated by a first thickness insulator material from the depletion mode channel region such that the at least one vertical gate to controls conduction in the depletion mode channel, and wherein providing a number of control variable signals includes providing the number of control variable signals to at least one vertical gate separated by a second thickness insulator material from the depletion mode channel region such that the at least one vertical gate to has a minimal or no control over conduction in the depletion mode channel.

95. The method of claim 89, wherein the method further includes outputting an output signals from the multiplexor based on a sensed conduction in the arrays of logic cells.

96. A method for operating a complementary double pass circuit, comprising:
    providing a number of input signals on a number of input lines;
    providing a complementary pair of output signals on a complementary pair of output lines;
    providing a number of control variable signals on a number of gate lines, wherein the complementary pair of output lines couple to a drain region in one or more arrays of transistors, wherein one of the complementary pair of output lines couples to a drain region for a first set of PMOS and NMOS transistors, and wherein one of the complementary pair of output lines couples to a drain region for a second set of PMOS and NMOS transistors, wherein each transistor in the array of transistors includes:
        a horizontal substrate, wherein the substrate includes a first source/drain region, a second source/drain region, and a depletion mode channel region separating the first and the second source/drain regions;
        a number of vertical gates located above different portions of the depletion mode channel region, each vertical gate coupled to a gate line;
        wherein at least one of the vertical gates separated from the channel region by a first thickness insulator material; and
        wherein at least one of the vertical gates separated from the channel region by a second thickness insulator material; and
    wherein providing the number of control variable signals on the number of gate lines selectively controls conduction in the number of transistors depending on whether the gate line couples to a vertical gate separated from the depletion mode channel by a first or a second thickness insulator material.

97. The method of claim 96, wherein providing the number of control variable signals on the number of gate lines includes providing a number of logic inputs to each transistor.

98. The method of claim 96, wherein operating the complementary double pass circuit further includes inputting a number of pass variables on a number of input lines and outputting a complementary pair of output signals on the complementary pair of output lines based on conduction through the depletion mode channels in array of transistors.

99. The method of claim 96, wherein providing a number of control variable signals on the number of gate lines includes applying a negative potential of approximately −0.6 Volts to at least one of the number of vertical gates such that the at least one vertical gate turns off conduction in the depletion mode channel.

100. The method of claim 96, wherein providing a number of control variable signals on the number of gate lines includes applying a potential to a number of vertical gates which serve as passing lines.

101. The method of claim 96, wherein providing a number of control variable signals on the number of gate lines includes independently applying potential values to the number of vertical gates.

102. The method of claim 96, wherein providing a number of control variable signals on the number of gate lines includes using at least one of the number of vertical gates in any transistor as a passing line includes and using at least one of the number of vertical gates in any transistor as an active input.

103. The method of claim 96, wherein providing a number of control variable signals on the number of gate lines includes providing a number of control variable signals to a number of edge defined vertical gates which have a horizontal width which is sub-lithographic in dimension.

104. The method of claim 96, wherein providing a number of control variable signals includes providing an number of logic inputs to each transistor such that less than one MOSFET is used for each logic input to the complementary double pass circuit.

* * * * *

UNITED STATES PATENT AND TRADEMARK OFFICE
CERTIFICATE OF CORRECTION

PATENT NO.      : 6,380,765 B1
DATED           : April 30, 2002
INVENTOR(S)     : Leonard Forbes and Kie Y. Ahn It is certified that error appears in the above-identified patent and that said Letters Patent is hereby corrected as shown below:

Column 2,
Line 19, delete "?" after "Pass-transistor".

Column 3,
Line 49, delete "pass" after "double-pass".

Column 7,
Line 34, delete "a" and insert -- an --, therefor.

Column 9,
Line 59, delete "a" and insert -- an --, therefor.

Column 23,
Line 5, delete "couples" after "line".

Signed and Sealed this

Twelfth Day of November, 2002

*Attest:*

*Attesting Officer*

JAMES E. ROGAN
*Director of the United States Patent and Trademark Office*